United States Patent [19]
Mizutani et al.

[11] Patent Number: 5,742,418
[45] Date of Patent: Apr. 21, 1998

[54] OPTICAL COMMUNICATION SYSTEM AND METHOD USING TWO KINDS OF LIGHT DIFFERENT BOTH IN POLARIZATION DIRECTION AND WAVELENGTH

[75] Inventors: Natsuhiko Mizutani, Yokohama; Toshihiko Ouchi, Machida, both of Japan

[73] Assignee: Canon Kabushiki Kaisha, Tokyo, Japan

[21] Appl. No.: 848,723

[22] Filed: May 19, 1997

Related U.S. Application Data

[63] Continuation of Ser. No. 404,331, Mar. 15, 1995, abandoned.

[30] Foreign Application Priority Data

Mar. 18, 1994 [JP] Japan ................... 6-074371

[51] Int. Cl.$^6$ ............................................. H04B 10/00
[52] U.S. Cl. ........................... 359/156; 359/192; 372/27
[58] Field of Search ............................. 359/156, 192, 359/173, 132; 385/11, 27; 372/27

[56] References Cited

U.S. PATENT DOCUMENTS

| | | | |
|---|---|---|---|
| 4,612,645 | 9/1986 | Liu et al. | 372/45 |
| 5,008,958 | 4/1991 | Cimini, Jr. et al. | 455/619 |
| 5,023,949 | 6/1991 | Auracher et al. | 359/192 |
| 5,091,912 | 2/1992 | Bretenaker et al. | 372/23 |
| 5,329,394 | 7/1994 | Calvani et al. | 359/156 |
| 5,388,088 | 2/1995 | Gans et al. | 359/156 |
| 5,408,349 | 4/1995 | Tsushima et al. | 359/192 |
| 5,424,861 | 6/1995 | Koning | 359/156 |
| 5,497,390 | 3/1996 | Tanaka et al. | 372/50 |
| 5,508,839 | 4/1996 | Ono | 359/156 |
| 5,517,589 | 5/1996 | Takeuchi | 385/24 |

FOREIGN PATENT DOCUMENTS

| | | | |
|---|---|---|---|
| 361151 | 6/1989 | European Pat. Off. | H04B 10/12 |
| 381341 | 1/1990 | European Pat. Off. | H04J 14/02 |
| 562514 | 3/1993 | European Pat. Off. | H04B 10/14 |
| 60-189981 | 9/1985 | Japan . | |
| 2159781 | 12/1988 | Japan | 359/181 |
| 2-159781 | 6/1990 | Japan | H01S 3/18 |
| 5063744 | 8/1991 | Japan | H04L 27/14 |

OTHER PUBLICATIONS 1.5 Gbit/s FSK Transmission System Using Two Electrode DFB Laser As A Tunable FSK Discriminator/Photodetector, Electronics Letters, vol. 26, p. 1146, No. 15 (1990).

*Primary Examiner*—Rafael Bacares
*Attorney, Agent, or Firm*—Fitzpatrick, Cella, Harper & Scinto

[57] ABSTRACT

In an optical communication system or method, two light signals having different wavelengths and different polarization directions are generated using a common modulation signal on a transmitter side, and the light signals transmitted over a light transmission line are wavelength-discriminated by a wavelength filtering unit disposed on a receiver side to demodulate a signal. The filtering unit may include a plurality of filters which are arranged so that the transmitted light signals of different wavelengths are respectively selected out thereby and a difference signal between outputs of the filters is produced to demodulate the signal.

36 Claims, 22 Drawing Sheets

OPTICAL COMMUNICATION SYSTEM AND METHOD USING TWO KINDS OF LIGHT DIFFERENT BOTH IN POLARIZATION DIRECTION AND WAVELENGTH

This application is a continuation of application Ser. No. 08/404,331 filed Mar. 15, 1995, now abandoned.

BACKGROUND OF THE INVENTION

1. Field of the Invention

The present invention relates to an optical communication method for stably achieving a high-density optical frequency division multiplexing (FDM) communication and the like by using a light source which can be driven by a direct modulating method with dynamic wavelength fluctuation suppressed even during a high-speed modulation, an optical communication system for performing the optical communication method and so forth.

2. Related Background Art

In recent years, increased transmission capacity in the field of optical communications has become desirable, and the development of optical FDM communication, in which signals at a plurality of optical frequencies are multiplexed in a single optical fiber, has been advanced.

There are two kinds of optical FDM communication methods, which are classified by the type of light signal used in the receiving technique. One method is a coherent optical communication in which a beat signal is produced between signal light and light from a local oscillator to obtain an intermediate-frequency output, and that output is detected. The other method is one in which only light at a desired wavelength or optical frequency is selected by a tunable filter, and the thus-selected light is detected. The latter method, known as an optical-frequency tunable filtering method, will be described.

The tunable filter may comprise one of a Mach-Zehnder type, a fiber Fabry-Perot type, an acousto-optic (AO) type, a semiconductor filter type and the like, which have been respectively developed.

In the Mach-Zehnder filter type and the fiber Fabry-Perot filter type, the transmission bandwidth can be relatively freely designed and a width of several Å0 can be obtained, so that the frequency multiplicity of optical FDM communication can be increased. Further, there is a great advantage in that the polarization state of signal light does not adversely affect the quality of signal receiving. An example of a Mach-Zehnder type filter is disclosed in K. Oda et al. "Channel Selection Characteristics of Optical FDM Filter", OCS 89-65, 1989. An example of a fiber Fabry-Perot type filter is disclosed in I. P. Kaminow et al. "FDMA-FSK Star Network with a Tunable Optical Filter Demultiplexer", IEEE J. Lightwave Technol., vol. 6, No. 9, p. 1406, September, 1988. Those filter types, however, have the disadvantages that considerable light loss occurs and that downsizing of a receiver device is difficult because the integration of a semiconductor photodetector and the filter is impossible.

In the AO modulator filter type, the receiving control is easy since the transmission bandwidth is large, e.g., several tens of Å, but the multiplicity of transmitted wavelengths cannot be increased. An example of an AO modulator type filter is disclosed in N. Shimosaka et al. "A photonic wavelength division/time division hybrid multiplexed network using accoustic tunable wavelength filters for a broadcasting studio application", OCS 91-83, 1991. This filter type, however, has the drawbacks that light loss occurs, that the integration with a semiconductor photodetector is impossible and that polarization control of signal light is necessary because the polarization state of signal light adversely affects the quality of the received signal.

In the semiconductor filter type, e.g., a distributed feedback (DFB) filter provided with a diffraction grating formed in a light guide layer for single longitudinal mode operation, the transmission bandwidth can be narrowed (e.g., down to about 0.5 Å), the optical amplification function (approx. 20 dB) exists, the multiplicity of transmitted wavelengths can be increased and the minimum receiving sensitivity can be improved (i.e., the minimum receiving intensity can be reduced). An example of a semiconductor type filter is disclosed in T. Numai et al. "Semiconductor Tunable Wavelength Filter", OQE 88-65, 1988. Further, this type of filter can be formed with the same material as a semiconductor photodetector, so that integration and downsizing are feasible.

On the other hand, in an optical communication system using the above kinds of filters and a semiconductor laser as a light source, the semiconductor laser is required to have stable oscillation and polarization direction and to maintain a dynamic single mode. Therefore, a DFB laser, a distributed Bragg reflector (DBR) laser, or the like is used as a semiconductor laser since each radiates in only the transverse electric (TE) mode. At present, the most popular modulation system for transmission signals in transmission systems is digital amplitude modulation, or amplitude shift keying (ASK) in which a drive current injected into a laser is directly modulated, or digital frequency modulation or frequency shift keying (FSK) in which a signal current having a minute amplitude is superposed on a bias current.

In the FSK system, techniques have been developed, for example, for using the wavelength discrimination function of an optical filter to demodulate signals. In this connection, reference should be made to M. J. Chawki et al. "1.5 Gbit/s FSK Transmission System Using Two Electrode DFB Laser As A Tunable FSK Discriminator/Photodetector", Electron. Lett. Vol. 26 No. 15, p. 1146, 1990.

Furthermore, another system has been proposed in which the polarization mode of oscillated light from a DFB laser is switched between light in TE and TM (transverse magnetic) modes and only one of TE and TM modes is selected (see, for example, Japanese Patent Laid-Open No. 2(Heisei)-159781). When an ordinary DFB laser is used, however, it is difficult to reduce a modulated drive current below 10 mA because there is a great difference in gain of its active layer between TE and TM modes. Thus, dynamic wavelength fluctuation is not so highly decreased, even compared with the ASK system.

Further, in the direct optical intensity or amplitude modulation system, however, the spectral line width is widened to about 0.3 nm due to the dynamic wavelength fluctuation. In addition, the wavelength tunable width is typically approximately 3 nm, so that the number of channels cannot be made large and hence the direct ASK modulation system is unsuitable for the frequency or wavelength division multiplexing transmission (generally, the optical frequency or wavelength interval between adjacent channels in the frequency division multiplexing transmission is much narrower than that in the wavelength division multiplexing transmission). On the other hand, when an external intensity modulator is used to modulate constant-intensity light from a light source or semiconductor laser, the number of devices will increase and hence this system is disadvantageous in cost even though the wavelength fluctuation can be reduced.

Further, in the direct frequency modulation system, the channel width is narrow and hence the number of channels can be increased. However, the tracking control of a tunable filter needs to be accurately performed. Further, there is a tendency for crosstalk between wavelengths indicating codes "1" and "0" to occur depending on a change in surroundings, and an error rate of received signals increases.

Further, in the polarization modulation system in which the polarization mode is switched, though the modulation can be performed by a minute signal, a polarizer disposed in front of the emission end of a laser and a filter disposed at the side of a receiver are needed to perform a signal transmission with a deep modulation. Thus, the number of devices and cost cannot be reduced.

SUMMARY OF THE INVENTION

It is an object of the present invention to provide an optical communication method for stably achieving a high-density optical FDM communication and the like by using a light source which can be driven by a direct modulating method with dynamic wavelength fluctuation suppressed even during a high-speed modulation, an optical communication system for performing the optical communication method and so forth.

In a communication system or method of the present invention, a light source for switching emitted light between two light signals having different wavelengths and different polarization directions in accordance with a modulation signal and transmitting the switched light signal to a transmission line is used and the transmitted light signal is demodulated on a receiver side using the wavelength discriminating function of an optical filter. Typically, the light source is a semiconductor laser in which oscillated light is switched between two light signals having different oscillation wavelengths and different polarization modes by minutely modulating a bias current injected through at least one of electrodes provided in a plurality of regions of the laser. The oscillated light is switched as above in accordance with signals of "1" and "0" by superimposing a minute-amplitude digital signal on a bias current near a switching bias point injected through at least one electrode, for example.

The structure of such a semiconductor laser will be briefly described. In a DFB semiconductor laser with two electrodes, a bias current injected through one electrode is controlled to be constant, and a digital signal is superimposed on a bias current injected through the other electrode to switch the oscillated light between TE mode and TM mode. During this operation, the oscillation wavelength is also switched since effective indices for TE and TM modes are different from each other. In a semiconductor laser for a 1.5 µm band, for example, the oscillation mode is switched by the modulation amplitude of 2 to 3 mA, and in this case a difference in the oscillation wavelength is several nanometers. When the modulation amplitude is controlled such that light output is maintained at a substantially constant magnitude during the switching operation, changes in internal photon density and carrier density in a cavity or resonator are small. So, the dynamic wavelength fluctuation due to the plasma effect is very small, and modulation frequency response characteristic is highly improved.

Thus, since the light output with small dynamic wavelength fluctuation and high frequency modulation efficiency can be obtained, compared with a conventional system, the signal can be demodulated by applying the wavelength discriminating function of an optical filter to the above-discussed construction, similar to the FSK system. That demodulation can be effected by demodulating the signal using a tunable filter without precise tracking control. Furthermore, a high-density optical frequency multiplexing communication can be realized without crosstalk problems because wavelengths corresponding to signals "1" and "0" are remote from each other.

Further, in an optical communication system or method of the present invention, the signal light from the polarization mode selective light source is wavelength-discriminated for wavelengths corresponding to "1" and "0" by using a plurality of filters and a difference signal between outputs of the filters is produced to demodulate the signal.

Specifically, in the case when a polarization sensitive filter is used, two solutions can be provided. First, with respect to light transmitted from a common light source and incident on a receiver portion, light having a first wavelength and polarized in a first direction and light having a second wavelength and polarized in a second direction perpendicular to the first direction are selected and the difference signal is produced from those two light signals to demodulate the signal, leading to enhancement of S/N. Second, with respect to light transmitted from a common light source and incident on a receiver portion, light having a first wavelength and polarized in a first direction and light having a second wavelength and polarized in the first direction are selected and the difference signal is produced from those two light signals to demodulate the signal, which will dispense with polarization plane control for light incident on a receiver portion.

Further, those solutions described immediately above can be combined. Namely, with respect to light transmitted from a common light source and incident on a receiver portion, light having a first wavelength and polarized in a first direction, light having a second wavelength and polarized in the first direction, light having the first wavelength and polarized in a second direction perpendicular to the first direction and light having the second wavelength and polarized in the second direction are selected and the difference signal is produced from those four light signals to demodulate the signal, which will dispense with polarization plane control for light incident on a receiver portion and thus improve S/N.

The object of the present invention is achieved by the following optical communication systems and methods and apparatuses used therein.

According to one aspect of the present invention, there is provided an optical communication system for communicating over a light transmission line that transmits signals from a transmitter side to a receiver side, which includes a transmitter for generating two light signals having different polarization directions and different wavelengths using a common modulation signal, and for transmitting the light signals to the light transmission line; and a filtering device for wavelength-discriminating the transmitted light signals to demodulate a signal. The filtering device may comprise a single filter which is used for selecting out one of the two light signals having the different wavelengths to demodulate the signal. Or, the filtering device may comprise a plurality of filters which are arranged so that the light signals of different wavelengths from the transmitter are respectively selected out by the filters and a difference signal between outputs of the filters is produced to demodulate the signal demultiplexed by said demultiplexer and directed to said filters.

According to another aspect of the present invention, there is provided a method for performing optical communication, in which two light signals having different wavelengths and different polarization directions are generated using a common modulation signal on a transmitter side; the light signals are transmitted over a light transmission line; and the transmitted light signals are wavelength-discriminated by a wavelength filtering device disposed on a receiver side to demodulate a signal.

According to still another aspect of the present invention, there is provided an opto-electric conversion apparatus which includes a transmitter for generating two light signals having different polarization directions and different wavelengths using a common modulation signal, and for transmitting the light signals to a light transmission line; and a filtering device for discriminating the transmitted light signals to demodulate a signal.

According to yet another aspect of the present invention, there is provided an optical cable television system for communicating over a light transmission line that transmits signal light from a broadcasting center to a subscriber side, which includes a transmitter apparatus disposed at the broadcasting center; and a receiver apparatus disposed on the subscriber side. The transmitter apparatus includes a device for generating two light signals having different polarization directions and different wavelengths using a common modulation signal, and for transmitting the light signals to the light transmission line. The receiver apparatus includes a filtering device for discriminating the transmitted light signals to demodulate a signal.

These advantages and others will be more readily understood in connection with the following detailed description of the preferred embodiments in conjunction with the drawings.

DESCRIPTION OF THE PREFERRED EMBODIMENTS

First Embodiment

A first embodiment of the present invention will be described with reference to FIGS. 1 through 4.

Figure 1:
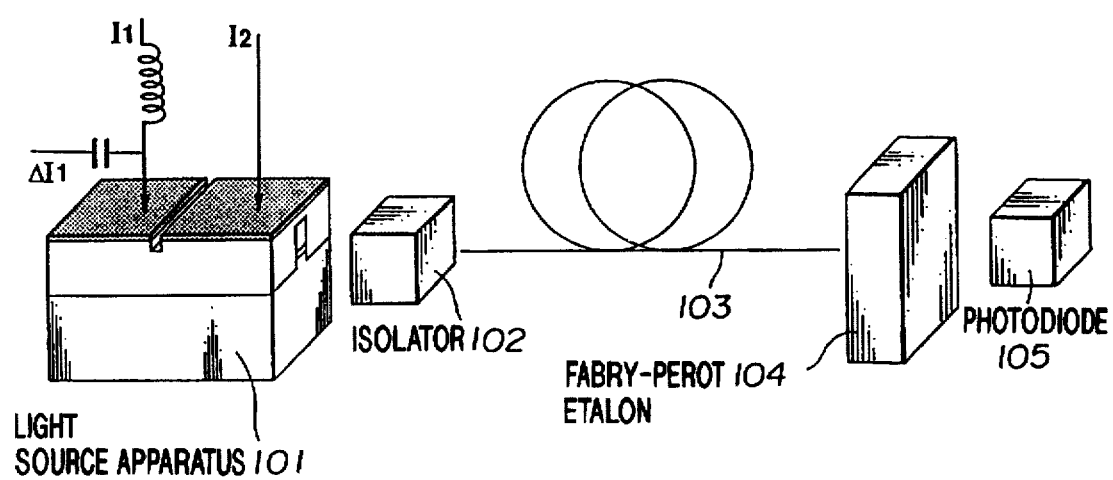
FIG. 1 is a view of a first embodiment of an optical communication system according to the present invention.
Figure 2A:
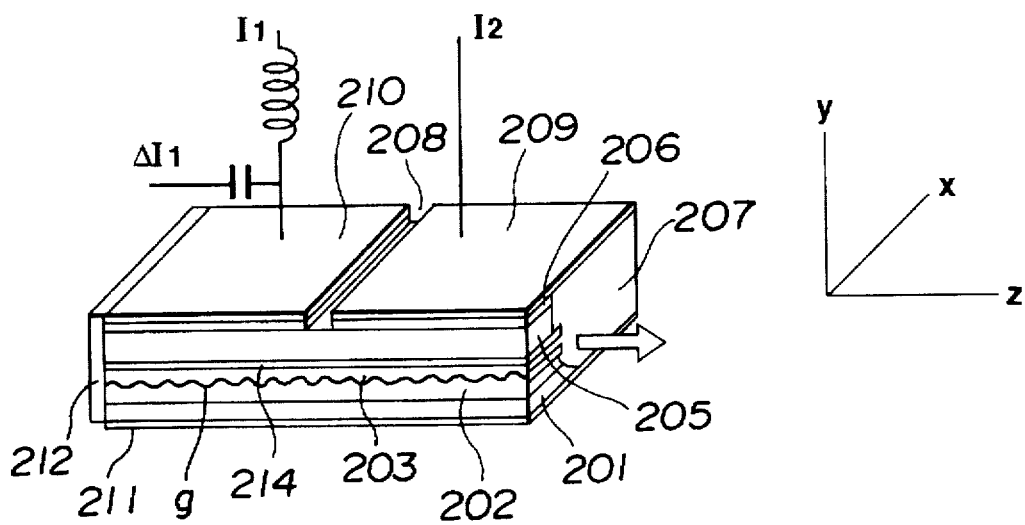
FIG. 2A is a view showing the structure of a DFB laser used as a light source in the first embodiment.

In FIG. 1, a light source apparatus 101 is a two-electrode DFB-LD (laser diode) semiconductor laser. Its details are illustrated in FIGS. 2A through 3D. As shown in FIG. 2A that illustrates a right half of a device, the light source 101 includes an n-type InP substrate 201, an n-type InP buffer layer 202 on which a diffraction grating g having a depth of 0.05 µm is formed, an n-type $In_{0.71}Ga_{0.29}As_{0.62}P_{0.38}$ lower light guide layer 203 having a thickness of 0.2 µm, an active layer 214 having a strained quantum well structure, a p-type InP clad layer 205, a p-type $In_{0.59}Ga_{0.41}As_{0.9}P_{0.1}$ contact layer 206, a high-resistance InP burying layer 207, an electrode separation region 208 which is formed by removing the contact layer 206, an electrode 209 of Cr/AuZnNi/Au film which is located on the light emission side through which a constant bias current $I_2$ is injected, an electrode 210 of Cr/AuZnNi/Au film through which a signal-superimposed current $(I_1+\Delta I_1)$ is injected, an electrode 211 of AuGeNi/Au film formed on the bottom of the substrate 201 and an antireflection coating 212 of SiO film. The active layer 214 is constructed of an intrinsic $In_{0.53}Ga_{0.47}As$ well layer (thickness: 5 nm) and an intrinsic $In_{0.28}Ga_{0.72}As$ barrier layer (thickness: 10 nm). In the active layer 214, transition energy between the level of heavy holes in the valence band and the ground level of electrons in the conduction band $(E_{hh0}-E_{e0})$ is made equal to transition energy between the level of light holes in the valence band and the ground level of electrons in the conduction band $(E_{lh0}-E_{e0})$. Therefore, when compared with an ordinary DFB laser, an oscillation threshold for TM mode is low and the oscillation polarization-mode switching between TE and TM modes can be effectively performed by properly controlling the current injected into the device, for example.

Figure 2B:
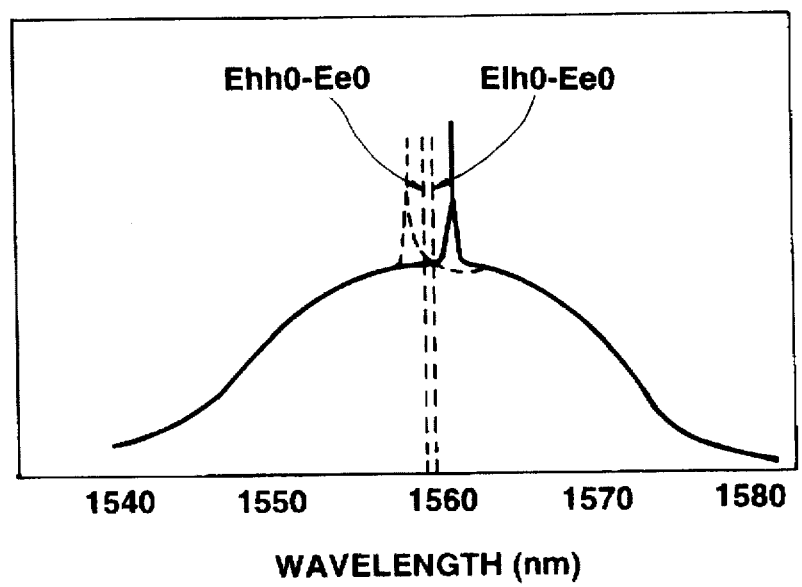
FIG. 2B is a graph illustrating characteristics of the DFB laser in the first embodiment.

The operation of this embodiment will be described. FIG. 2B illustrates oscillation spectra observed when bias currents are injected through the electrodes 209 and 210 and a state immediately prior to laser oscillation is established. The wavelength corresponding to the transition energy between the level of light holes and the ground level of electrons $(E_{lh0}-E_{e0})$ is approximately 1.56 µm, and the wavelength corresponding to the transition energy between the level of heavy holes and the ground level of electrons $(E_{hh0}-E_{e0})$ is also approximately 1.56 µm. Oscillation spectra of TE mode (solid line) and TM mode (dotted line) are substantially identical with each other. The pitch of the diffraction grating g is set to 240 nm such that the distributed feedback wavelengths for both modes determined by the diffraction grating g formed on the buffer layer 202 become shorter than 1.56 µm. Thus, the Bragg wavelength of TE mode becomes 1.552 µm and the Bragg wavelength of TM mode becomes 1.550 µm.

Figure 3A:
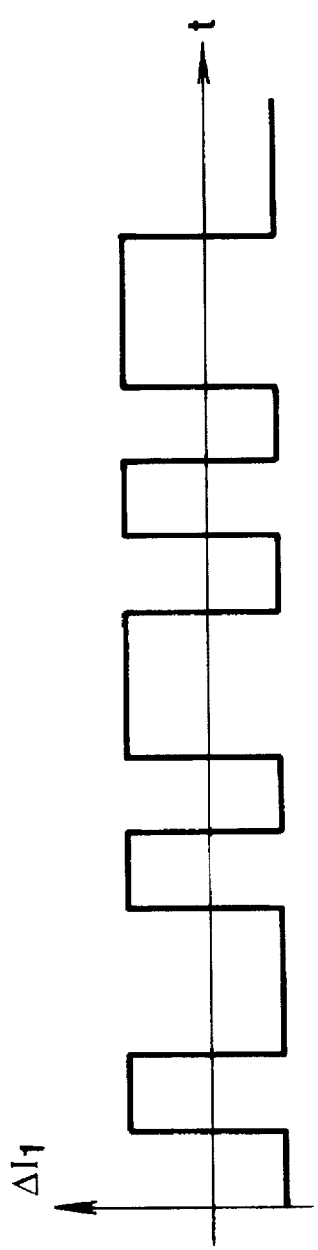
FIG. 3A is a graph illustrating a modulation current injected into the DFB laser in the first embodiment.
Figure 3B:
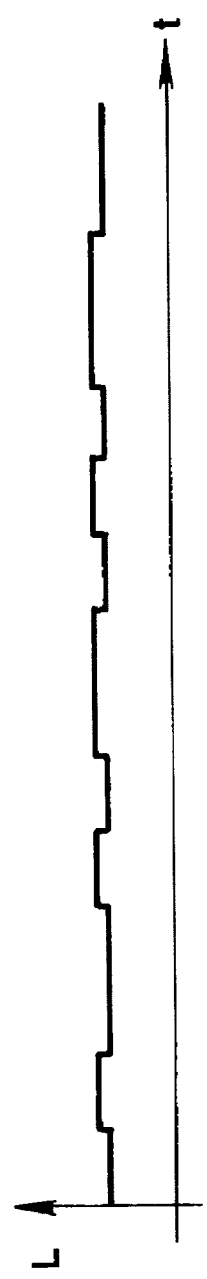
FIG. 3B is a graph illustrating the intensity of light from the DFB laser in the first embodiment.
Figure 3C:
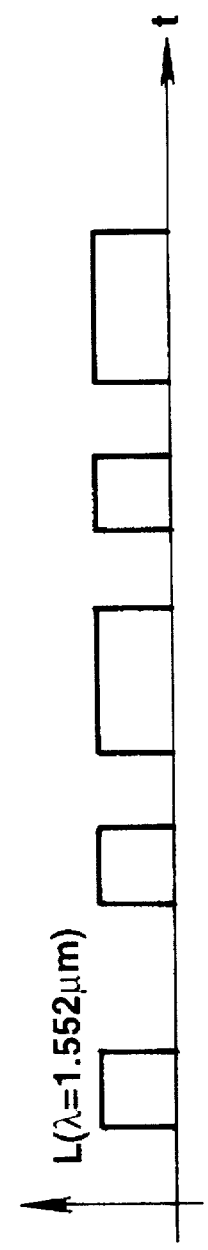
FIG. 3C is a graph illustrating the modulated intensity of light at a first wavelength from the DFB laser in the first embodiment.
Figure 3D:
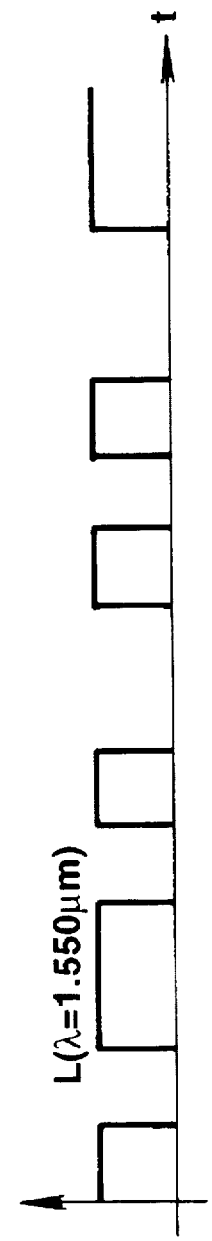
FIG. 3D is a graph illustrating the modulated intensity of light at a second wavelength from the DFB laser in the first embodiment.

The switching between TE and TM modes takes place as described above when a DC bias current 52 mA is injected through the electrode 209 and a digital signal having the amplitude of 5 mA is superposed on a DC bias current 27.6 mA injected through the electrode 210. At this time, the oscillation wavelength is switched between 1.552 µm and 1.550 µm. FIGS. 3A through 3D illustrate waveforms of respective signals. FIG. 3A illustrates the waveform of a modulation current on which the digital signal is superposed. FIG. 3B illustrates the waveform of a light output emitted from the laser 101. FIG. 3C illustrates the waveform of a light output having a wavelength of 1.552 µm and FIG. 3D illustrates the waveform of a light output having a wavelength of 1.550 µm. The output L of light emitted from the laser 101 remains substantially unchanged as illustrated in FIG. 3B, but its optical frequency or wavelength and polarization mode are modulated. The output waveform of light having a wavelength of 1.552 µm is in an in-phase relationship with the waveform of the modulation current, but in an anti-phase relationship with the output waveform of light having a wavelength of 1.550 µm. The modulation frequency ranges from 200 kHz to 5 GHz. Low frequency range characteristic is not good due to influences of heat.

Turning to FIG. 1, the output light from the light source 101, whose frequency and polarization modes are both modulated, is coupled to an optical fiber 103 through a polarization insensitive isolator 102 (i.e., the isolator 102 functions to the full, regardless of the polarization mode of light incident thereon) and transmitted through the optical fiber 103. As the optical fiber 103, a dispersion shift single mode fiber for a 1.55 µm band is employed. In the case when light is transmitted in a 1.3 µm band or in a 0.8 µm band, an appropriate optical fiber is used therefor.

The signal transmitted through the optical fiber 103 is demodulated as an FSK signal. In more detail, the signal is selectively demultiplexed or wavelength-separated, using a Fabry-Perot etalon 104 which has free spectral range (FSR) of 300 nm, finesse of 150 and central wavelength of 1.552 µm, and the selected signal is converted to an electric signal by a photodiode (PD) 105 (in this connection, see FIG. 3C or 3D). Thus, no tuning and tracking are needed at all on the side of the filter portion to receive the FSK signal, in contrast to a conventional FSK system in which tuning and tracking are needed to receive a modulated signal.

Figure 4:
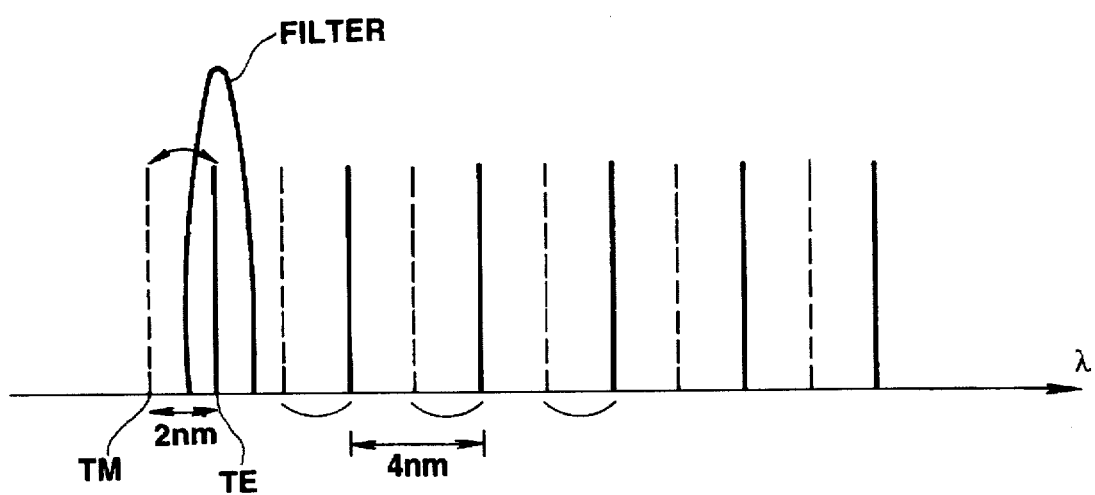
FIG. 4 is a view illustrating a first method of optical frequency division multiplexing.

Here, a single light source and a single receiving apparatus are used as depicted in FIG. 1, but a plurality of light sources and a plurality of receiving apparatuses may be respectively connected by optical couplers or the like. A first optical frequency division multiplexing method, in which optical transmission is conducted using those light sources and receiving apparatuses, is illustrated in FIG. 4. The oscillation wavelength of TE mode (indicated by solid line) is 2 nm away from the oscillation wavelength of TM mode (indicated by dotted lines) in each light source, and the transmission bandwidth between points at which the gain decreases by 10 dB of each filter is 3 nm. Therefore, multiplexing is performed with the wavelength interval being about 4 nm. As the filter, filters other than the Fabry-Perot etalon, such as a Mach-Zehnder type and a fiber Fabry-Perot type, may be used.

Second Embodiment

Figure 5A:
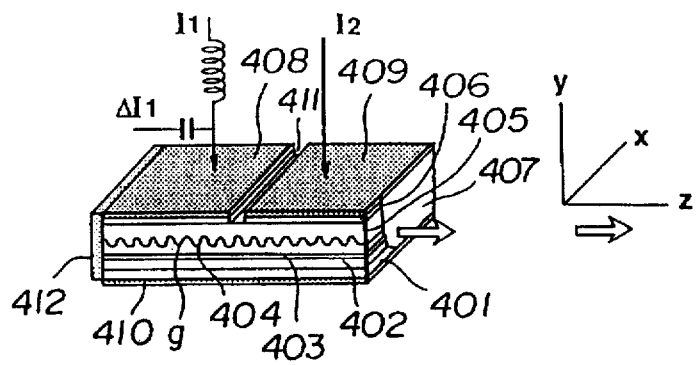
FIG. 5A is a view showing the structure of a DFB laser used as a light source in a second embodiment of an optical communication system according to the present invention.

A second embodiment of the present invention will be described with reference to FIGS. 5A through 6. FIG. 5A illustrates a cross section of a light source apparatus of a two-electrode DFB-LD semiconductor laser. On an n-type GaAs substrate 401, an n-type $Al_{0.5}Ga_{0.5}As$ lower clad layer 402, an active layer 403 having a multiple quantum well structure, a p-type $Al_{0.2}Ga_{0.8}As$ light guide layer 404 on which a diffraction grating g is formed, a p-type $Al_{0.5}Ga_{0.5}As$ upper clad layer 405, and a p-type GaAs cap layer 406 are layered. Further, a high-resistance $Al_{0.2}Ga_{0.8}As$ burying layer 407 is deposited, and electrodes 408 and 409 of Au/Cr film on the p-side and an electrode 410 of AuGe/Au film on the bottom surface of the substrate 401 are formed. An electrode separation region 411 is formed by removing the cap layer 406, and an antireflection coating 412 of $SiO_2$ film is formed on the end facet of the device.

Also in a light source 420 of this embodiment, a constant bias current $I_2$ is injected through the electrode 409 formed on the light emission side, and a signal-superimposed current, which is generated by superposing a digital signal $\Delta I_1$ on a constant bias current $I_1$, is injected through another electrode 408. Thus, the oscillation light from the light source 420 is switched between light of 820.0 nm in TE mode and light of 818.6 nm in TM mode.

Figure 5B:
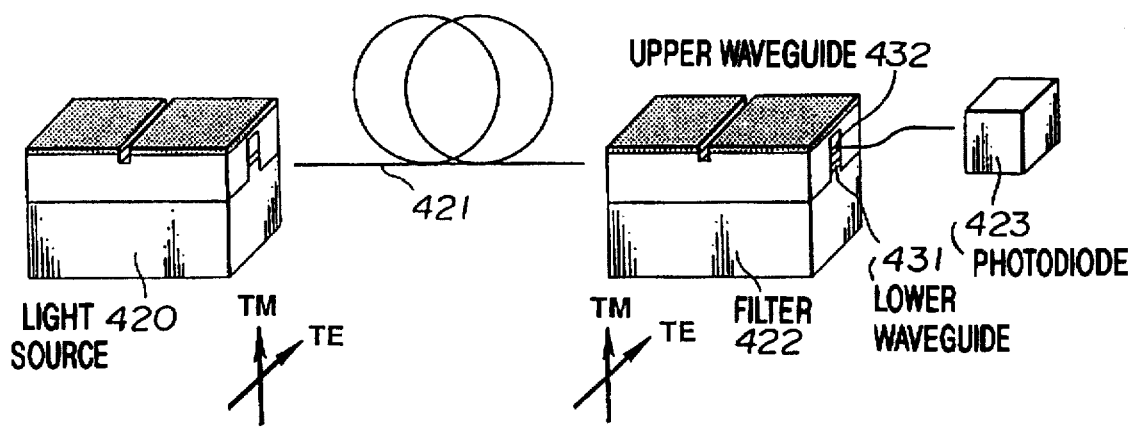
FIG. 5B is a view of the second embodiment.
Figure 6:
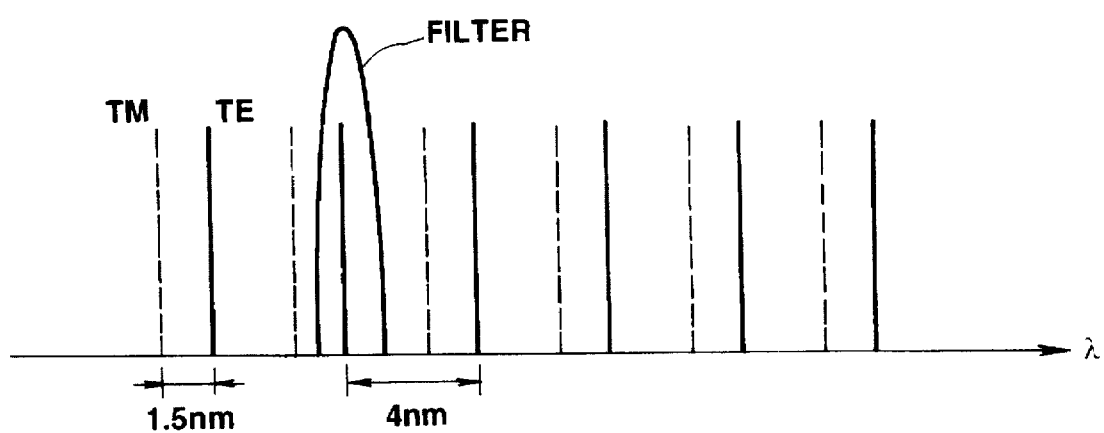
FIG. 6 is a view illustrating a second method of optical frequency division multiplexing.

Light emitted by the light source 420 is, as shown in FIG. 5B, coupled to a polarization conserving single mode fiber 421 and transmitted therethrough. The transmission wavelength of a filter 422 provided in a receiver portion has a polarization dependency. If the fiber was an ordinary one, the polarization plane of signal light would vary on the receiver side due to a change in temperature and the like, leading to degradation in signal intensity. This unfavorable situation is prevented by the polarization conserving single mode fiber 421 which conserves the polarization state of light transmitted therethrough. As the filter 422, a vertical (two upper and lower waveguides are formed with respect to the layering direction) directional coupler type filter 422, which has a large tunable or wavelength-changeable width, is used in the receiver portion. The filter 422 has a transmission full-width of 3 nm. The central wavelength of the filter 422 is tuned to 820.0 nm for demultiplexing. When signals are input into a lower waveguide 431, only a signal of a selected wavelength is guided into an upper waveguide 432 and this signal is converted to an electric signal by a photodiode (PD) 423.

Figure 5C:
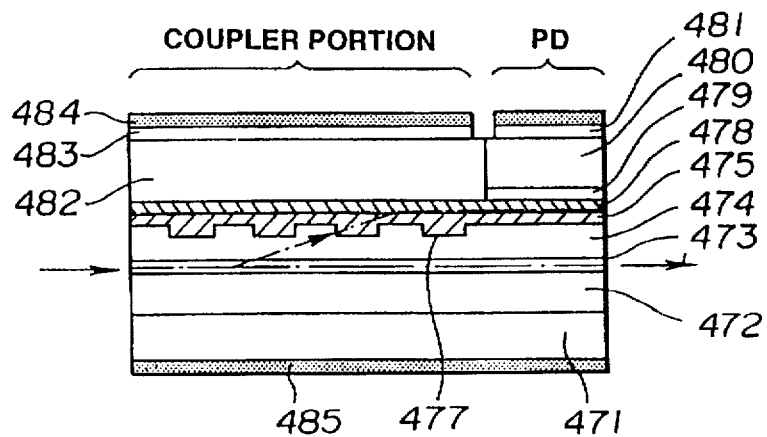
FIG. 5C is a cross-sectional view showing the structure of a vertical directional coupler type filter used as a filter in the second embodiment.

The directional coupler filter 422 and the photodiode (PD) 423 having the structure as shown in FIG. 5C is fabricated in the following manner. The filter and the photodiode are integrated on a common substrate. As shown in FIG. 5C, an n-type buffer layer 472, an n-type lower waveguide layer 473 and an n-type clad layer 474 are consecutively layered on an n-type substrate 471 during a first growth process. A diffraction grating 477 is formed in a forward-direction coupler portion of the clad layer 474. No grating is formed in a photodetector (PD) portion. Then, an n-type light guide layer 475, an n-type upper waveguide layer 478, an undoped absorptive or active layer 479, a p-type clad layer 480 and a p-type contact layer 481 are consecutively layered on the clad layer 474 during a second growth process. Then, in the forward-direction coupler portion, etching is performed down to the upper waveguide layer 478 to remove the active layer 479, and a p-type clad layer 482 and a p-type contact layer 483 are layered during a third selective growth process.

The waveguide is constructed by a burying structure using a high-resistance material (not shown). Then, a p-side electrode 484 and an n-side electrode 485 are formed, and portions of electrode 484 and contact layer 481 between the forward-direction coupler portion and the photodetector portion are removed. In this structure, light is input into the lower waveguide layer 473 in the forward-direction coupler portion, and only light of a selected wavelength portion (820.0nm and its polarization mode is in TE mode) is coupled to the upper waveguide layer 478 and propagated therethrough to be detected by the photodetector. TM light of 818.6 nm is transmitted through the lower waveguide 473 without any change, and emitted outside. In the forward-direction coupler portion, the central filtering wavelength can be changed by applying an electric field thereto.

Also in this embodiment, a single light source apparatus 420 and a single receiving apparatus 422 and 423 is shown, but a plurality of light sources and a plurality of receving apparatuses may be respectively connected by optical couplers or the like. An optical frequency division multiplexing method, in which optical transmission is conducted using those light sources and receiving apparatuses, is illustrated in FIG. 6. The oscillation wavelength of TE mode (indicated by solid lines) is 1.5 nm away from the oscillation wavelength of TM mode (indicated by dotted lines), and the 10 dB-down transmission bandwidth of a filter is 3 nm. Also in this embodiment, multiplexing is conducted with the wavelength interval being about 4 nm. The multiplicity number of division multiplexing transmission is determined by the wavelength changeable width of the tunable filter 422. When a tunable filter having a tunable width of 60 nm is used, the multiplexing transmission of about 16 channels can be performed without precise tuning control.

Third Embodiment

Figure 7:
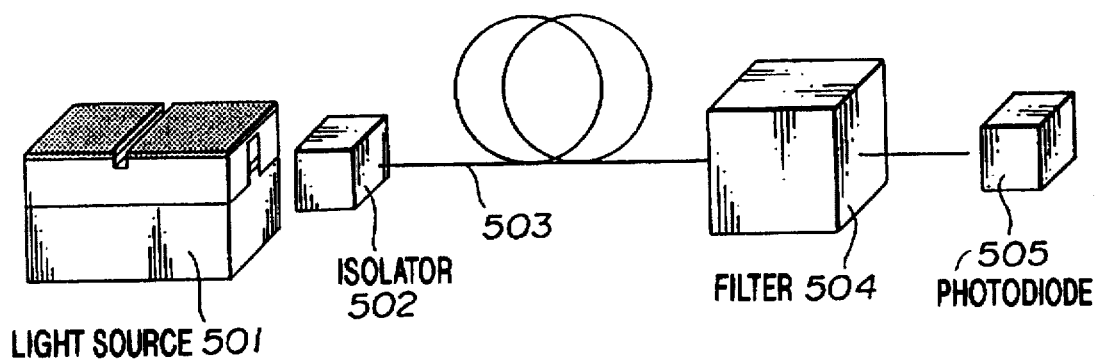
FIG. 7 is a view of a third embodiment of an optical communication system according to the present invention.

The third embodiment will be described with reference to FIGS. 7 and 8. In FIG. 7, a light source apparatus 501 is an oscillation polarization mode selective DFB laser of a 1.5 μm-band wavelength, similar to the first embodiment. Output light from the light source 501, whose optical frequency and polarization mode are both modulated, is coupled to an optical fiber 503 through a polarization insensitive isolator 502 and transmitted through the optical fiber 503. Light transmitted through a filter 504 in a receiver portion is converted to an electric signal by a photodiode 505. As the filter of the receiver portion, a fiber Fabry-Perot etalon, which has FSR of 8 nm, finesse of 100 and central wavelength of 1.552 μm, is used.

Figure 8:
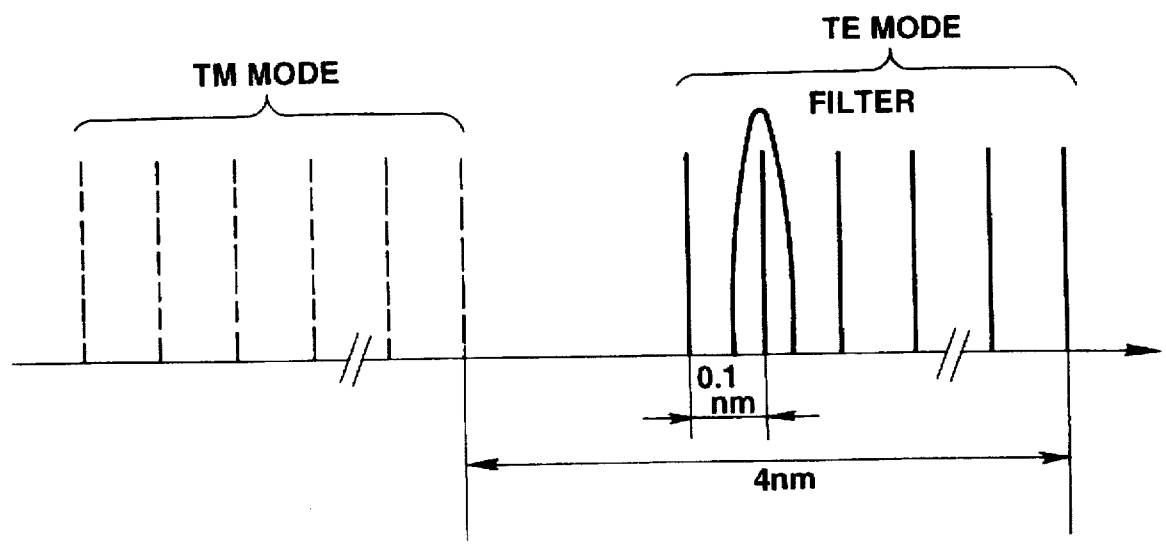
FIG. 8 is a view illustrating a third method of optical frequency division multiplexing.

FIG. 8 shows a wavelength division multiplexing optical transmission method using the system as shown in FIG. 7. In this embodiment, the transmission width of the filter 504 is narrow and the dynamic wavelength fluctuation of the light source 501 is small, so it is possible to increase the multiplicity number of the wavelength multiplexing transmission. The oscillation wavelength of TE mode (indicated by solid lines) is 4.0 nm away from the oscillation wavelength of TM mode (indicated by dotted lines), and the 10 dB-down transmission bandwidth of the fiber Fabry-Perot etalon filter 504 is 0.1 nm. Therefore, wavelength multiplexing can be conducted with the wavelength interval being 0.1 nm. When a light source apparatus 501 having a tunable width of 3 nm is used, multiplexing transmission of about 30(=3/0.1) channels can be performed. Here, the oscillation wavelength of TE mode is about 4 nm away from the oscillation wavelength of TM mode, and the oscillation wavelength of TM mode is in a wavelength range shorter than the side of a wavelength band which involves 30 channels in TE mode. As a result, optical transmission with little crosstalk can be achieved by optical signal transmission of an FSK system, without performing the polarization separation by a polarizer.

Fourth Embodiment

Figure 9:
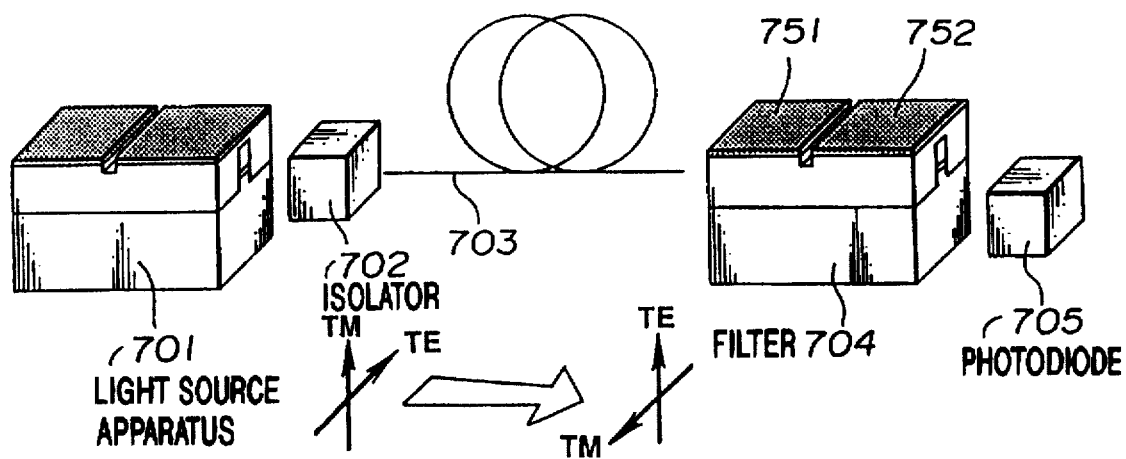
FIG. 9 is a view of a fourth embodiment of an optical communication system according to the present invention.

The fourth embodiment will be described with reference to FIGS. 9, 10 and 11. In FIG. 9, a light source apparatus 701 is an oscillation polarization mode selective DFB laser of a 1.5 μm-band wavelength, similar to the first embodiment. The oscillation light is switched between light of 1.552 μm in TE mode corresponding to a modulation signal of "1" and light of 1.548 μm in TM mode corresponding to a modulation signal of "0". Output light from the light source 701, whose frequency and polarization mode are both modulated, is coupled to a polarization conserving single mode fiber 703 through a polarization insensitive isolator 702 and transmitted through the optical fiber 703. Similar to the second embodiment, the transmission wavelength of a filter 704 provided in a receiver portion has a polarization dependency. So, if the polarization plane of signal light is varied on the receiver side due to a change in temperature and the like, the signal intensity would be degraded. This drawback is prevented by the polarization conserving single mode fiber 703. As the filter 704, a tunable filter, which has a narrow transmission bandwidth, is used in the receiver portion to demultiplex light of a desired wavelength. Light transmitted through the filter 704 of the receiver portion is converted to an electric signal by a photodiode 705.

Figure 10A:
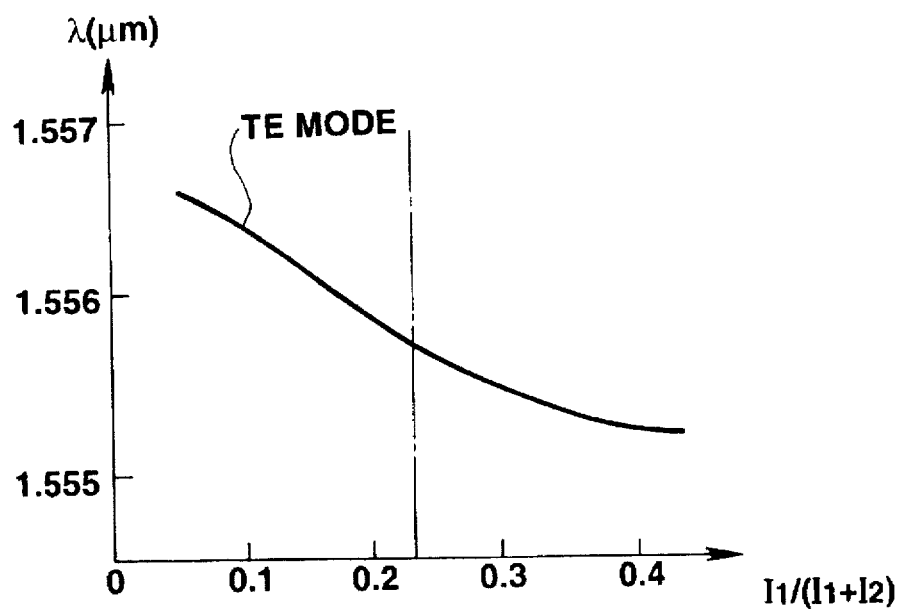
FIG. 10A is a graph illustrating tuning characteristics of a DFB filter.
Figure 10B:
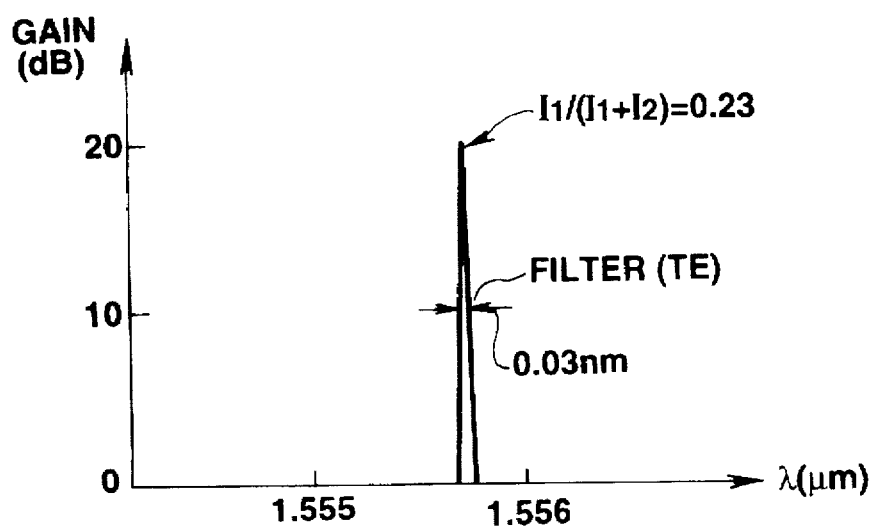
FIG. 10B is a graph illustrating transmission bandwidth characteristics of a DFB filter.

The optical filter 704 has the same layer structure as the light source 701, and is provided with two separated electrodes 751 and 752. The DFB filter 704 is used with a current below its threshold injected thereinto. Different from the light source 701, the diffraction grating pitch of the filter 704 is changed to 241 nm (i.e., is made a little longer from 240 nm), and the Bragg wavelength is shifted to a longer value. Further, $SiO_2$ antireflection coatings are provided on opposite end facets of the filter 704. The transmission wavelength can be changed by 3 nm while maintaining a transmission gain at 20 dB, by controlling a ratio $I_1/(I_1+I_2)$ between currents $I_1$ and $I_2$ injected through the two electrodes 751 and 752. An example of the current ratio dependency of the transmission wavelength is illustrated in FIG. 10A. This graph shows characteristics for TE mode of the optical filter 704. When coupled in TM mode, the transmission peak appears at a position about 4 nm shorter than that illustrated in FIG. 10A. The 10 dB-down transmission width of the filter 704 is 0.03 nm as illustrated in FIG. 10B, and this value of 0.03 nm is sufficient to attain wavelength division multiplexing with the channel interval of 0.05 nm. The polarization conserving fiber 703 is coupled to the filter 704 so that a polarized component of light emitted from the fiber 703, which corresponds to TE mode of the light source 701, can couple to TM mode of the filter 704. The filter 704 is tuned so that the transmission peak for TM mode of the filter 704 is equal to 1.552 µm which is the oscillation wavelength in TE mode of the light source 701. In more detail, signal light emitted from the light source 701 as TE light of 1.552 µm is transmitted through the DFB filter 704 as TM light of 1.552 µm, while signal light emitted from the light source 701 as TM light of 1.548 µm cannot be transmitted through the DFB filter 704 because this signal light enters the filter 704 as TE light of 1.548 µm. Light transmitted through the filter 704 is converted to an electric signal by the photodiode 705. The receiver portion is constructed as discussed above, so that signal light emitted from the light source 701 as an FSK signal can be received, using the DFB filter 704 as a wavelength discriminator.

Figure 11:
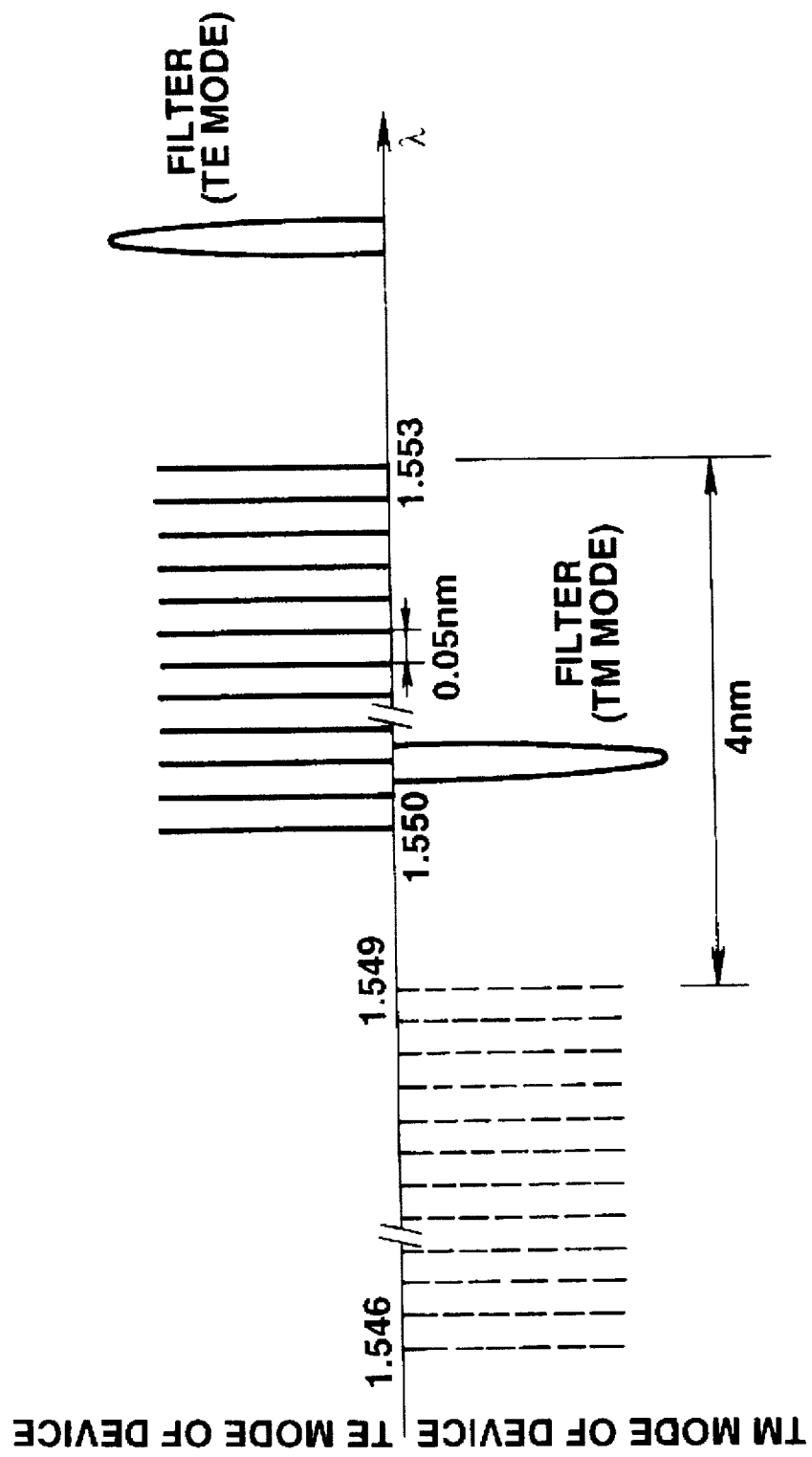
FIG. 11 is a view illustrating a fourth method of optical frequency division multiplexing.

FIG. 11 shows a fourth optical frequency division multiplexing optical transmission using the system as shown in FIG. 9. In this embodiment, the oscillation wavelength of the light source 701 is switched with an interval of 4 nm, the 10 dB-down transmission bandwidth of the filter 704 is 0.03 nm and wavelength multiplexing is performed with an interval of 0.05 nm. The wavelength bandwidth of oscillation in TE mode (indicated by solid lines in an upper part of FIG. 11) ranges over a width of about 3 nm from 1.550 µm to 1.553 µm, and the bandwidth of oscillation in TM mode (indicated by dotted lines in a lower part of FIG. 11) ranges over a width of about 3 nm from 1.546 µm to 1.549 µm.

On a receiver side, wavelength discrimination is performed using TM mode (a lower part of FIG. 11) of the DFB filter 704, and the transmission wavelength of TE mode (an upper part of FIG. 11) of the DFB filter 704 is located in a wavelength range longer than the used optical frequency band. So, the problem of crosstalk and the like can be solved.

The construction of the receiver portion is not limited to the above-discussed one. TM mode of the light source 701 may be coupled to TE mode of the DFB filter 704 on the receiver side through the polarization conserving fiber 703, and the wavelength of TE mode of the DFB filter 704 may be tuned to the wavelength of TM mode of the light source 701. In this case, the transmission wavelength of TM mode (a lower part of FIG. 11) of the DFB filter 704 can be located in a wavelength range shorter than the used optical frequency band. So, the problem of crosstalk and the like can also be eliminated in this case.

Fifth Embodiment

The fifth embodiment will be described with reference to FIG. 12. In the above communication systems using a oscillation polarization mode selective laser, only one wavelength or polarization of signals emitted in accordance with "1" and "0" is discriminated and demodulated to a signal, and the other of the transmitted signals is abandoned. Both signal portions are used in an optical communication system of this embodiment.

Figure 12:
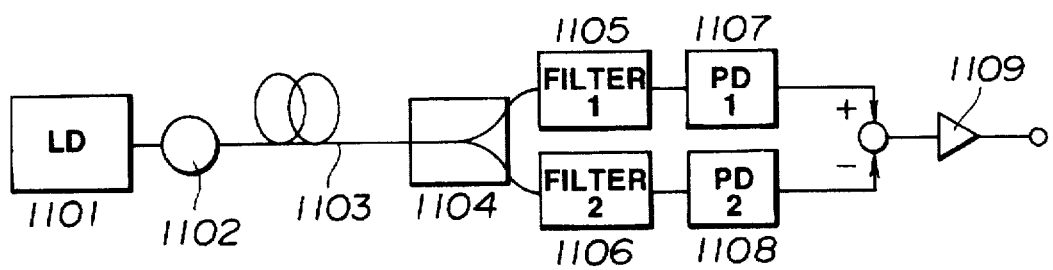
FIG. 12 is a view of a fifth embodiment of an optical communication system according to the present invention.

In FIG. 12, a light source 1101 is an oscillation polarization mode selective DFB laser with two electrodes, similar to the first embodiment. Compared with an ordinary DFB laser, an oscillation threshold value for TM mode is small, and the polarization mode switching can be effectively conducted in this laser. In the laser 1101, the grating pitch is set such that the Bragg wavelength for TE mode becomes 1.552 µm and the Bragg wavelength for TM mode becomes 1.550 µm. As for the remaining points, the laser 1101 is substantially the same as the light source 101 in FIG. 1.

Output light of the laser 1101 is coupled to an optical fiber 1103 through a polarization insensitive isolator 1102, and transmitted therethrough. A dispersion shift single mode fiber for a 1.55 µm-band wavelength is used as the optical fiber 1103. In the case when light is transmitted in a 1.3 µm band or in a 0.8 µm band, an appropriate optical fiber is used therefor. Signal light transmitted through the optical fiber 1103 is divided into two portions by a beam splitter, and the divided portions are respectively wavelength-selected by Fabry-Perot etalons 1105 and 1106. The thus-transmitted light is converted to electric signals by photodiodes (PD) 1107 and 1108. The Fabry-Perot etalon 1105 has FSR of 300 nm, finesse of 150 and central wavelength of 1.552 µm, while the Fabry-Perot etalon 1106 has FSR of 300 nm, finesse of 150 and central wavelength of 1.550 µm. A difference signal is created from outputs of the photodiodes 1107 and 1108 by a differential amplifier 1109, and thus demodulated signal can be taken out. In this embodiment, the polarization insensitive filters or etalons 1105 and 1106 are used, and signals corresponding to both of "1" and "0" of digital signals are detected.

Sixth Embodiment

Figure 13:
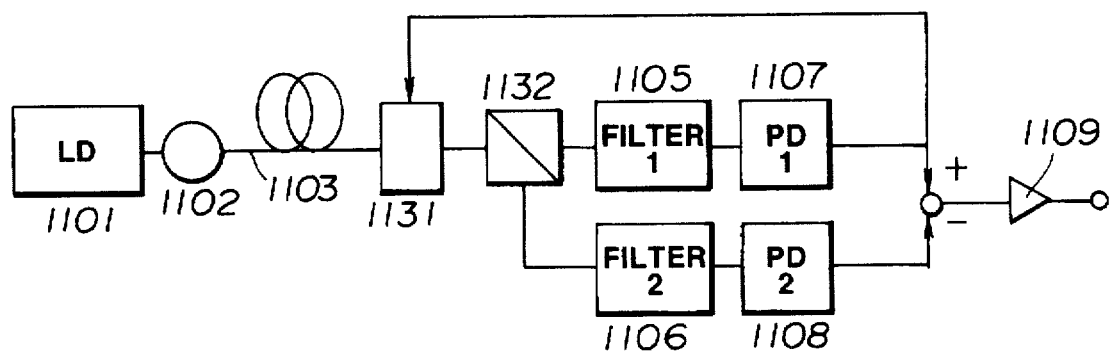
FIG. 13 is a view of a sixth embodiment of an optical communication system according to the present invention.

The sixth embodiment will be described with reference to FIG. 13. The sixth embodiment differs from the fifth embodiment in that a polarization control device 1131 and a polarization beam splitter (PBS) 1132 are used in place of the beam splitter 1104 and the polarization control and demultiplexing of transmitted signal are conducted. The polarization control device 1131 controls the polarization plane of the signal such that the intensity of light at a first wavelength 1.552 µm incident on the Fabry-Perot etalon 1105 from the PBS 1132 becomes maximum and the output of the photodiode 1107 culminates. Here, since the polarization direction of light at a second wavelength 1.550 µm is perpendicular to that of the first wavelength, the intensity of light at a wavelength 1.550 µm incident on the Fabry-Perot etalon 1106 from the PBS 1132 also becomes maximum. Thus, S/N is improved about 3 dB, compared with the fifth embodiment. The method of using the polarization control device of this embodiment can also be adopted in other embodiments, if applicable.

Here, a single light source and a single receiving apparatus are shown, but a plurality of light sources and a plurality of receiving apparatuses may be respectively connected by optical couplers or the like. Optical frequency division multiplexing method in which optical transmission is conducted using the system of the fifth or sixth embodiment, is illustrated in FIG. 4. The wavelengths of the light sources can be changed, for example, by preparing a plurality of light sources in which bandgaps of active layers and grating pitches of light guide layers are respectively varied little by little.

Also in the fifth and sixth embodiments, as the filter, other polarization insensitive filters, such as Mach-Zehnder type and fiber Fabry-Perot type, may be used.

Depending on the kind of a filter, the relationship between the transmission bandwidth of the filter and a wavelength difference between TE and TM modes of the light source varies, so another multiplexing method as described in FIG. 8 may be considered. That is, when the 10 dB-down transmission bandwidth of the filter is sufficiently smaller than the oscillation wavelength interval between TE and TM modes, light emitted by a plurality of light sources will be multiplexed. Specifically, when a light source having a TE-TM wavelength interval of 4 nm and a filter having a 10 dB-down transmission bandwidth of 0.1 nm are used, wavelength multiplexing can be performed according to the method of FIG. 8 with the channel interval of 0.2 nm and the wavelength multiplicity of about 20(=4/0.2). In this case, a plurality of light sources with the same structure are driven by different bias currents to emit different wavelengths therefrom.

Seventh Embodiment

Figure 14A:
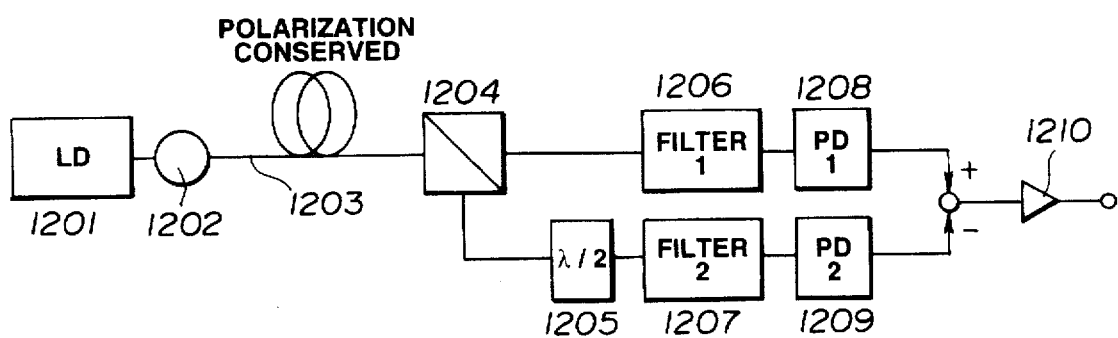
FIG. 14A is a view of a seventh embodiment of an optical communication system according to the present invention.

The seventh embodiment will be described with reference to FIG. 14A. In a communication system of this embodiment, a polarization sensitive waveguide type filter is used. In FIG. 14A, a light source apparatus 1201 is an oscillation polarization mode selective semiconductor laser used in the fifth and sixth embodiments, and its oscillation light is switched between light of 1.552 μm in TE mode and light of 1.548 μm in TM mode. Output light of the laser 1201 is coupled to a polarization conserving optical fiber 1203 through a polarization insensitive isolator 1202, and transmitted therethrough. The signal light transmitted through the optical fiber 1203 is divided into two portions by a PBS 1204. Light of 1.552 μm in a first polarization mode, which corresponds to TE mode of the light source 1201, is coupled to TE mode of a first DFB filter 1206. The direction of a polarization plane can be decided by using the polarization conserving fiber 1203. Light of 1.548 μm in a second polarization mode, which corresponds to TM mode of the light source 1201, is split by the PBS 1204, and coupled to TE mode of a second DFB filter 1207 through a λ/2 plate 1205. The transmission wavelength for TE mode of the DFB filter 1206 is tuned to 1.552 μm, while the transmission wavelength for TE mode of the DFB filter 1207 is tuned to 1.548 μm. Thus-transmitted light is converted to electric signals by photodiodes (PD) 1208 and 1209, and a difference signal between outputs from the photodiodes 1208 and 1209 is taken by a differential amplifier 1210 to produce a demodulated signal. Also in the communication system of this embodiment, both signals corresponding to "1" and "0" of digital signals are detected, similar to the fifth and sixth embodiments. Particularly, a waveguide type device is used as each of the filters 1206 and 1207, so that a compact structure can be obtained by integrating devices in the receiver portion.

In this embodiment, the polarization conserving fiber 1203 is used, and the TE mode light is coupled to TE mode of the DFB filter 1206. However, similar to the sixth embodiment, an ordinary single mode fiber and a polarization control device may be used and feedback control may be performed using the output of the photodetector 1208, for example.

Further, in this embodiment, the λ/2 plate 1205 is used, and the TM mode light of the light source 1201 is coupled to TE mode of the DFB filter 1207. However, the TM mode light of the light source 1201 may be coupled to TM mode of the DFB filter 1207, and the transmission wavelength for TM mode of the DFB filter 1207 may be tuned to 1.548 μm.

Moreover, a two-division demultiplexer may be used in place of the PBS 1204. In this case, the signal intensity will decrease by 3 dB, but the integration of devices becomes easy to perform and coupling losses can be reduced.

Eighth Embodiment

The eighth embodiment will be described with reference to FIG. 14B. In a communication system of this embodiment, a polarization sensitive waveguide type filter is used, similar to the seventh embodiment. In a filter of this embodiment, only light of a predetermined wavelength is demultiplexed to be output through a first port and light at other wavelengths is caused to be output through a second port. A vertical directional coupler type filter (VDF: see the second embodiment) having a large wavelength changeable width is used, for example.

Figure 14B:
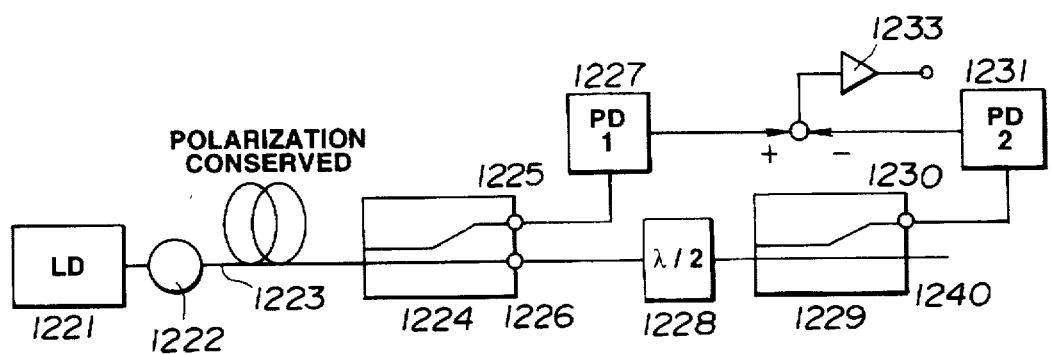
FIG. 14B is a view of an eighth embodiment of an optical communication system according to the present invention.

In FIG. 14B, a light source apparatus 1221 is an oscillation polarization mode selective semiconductor laser used in the above embodiments, and its oscillation light is switched between light of 1.552 μm in TE mode and light of 1.548 μm in TM mode. Output light of the laser 1221 is coupled to a polarization conserving optical fiber 1223 through a polarization insensitive isolator 1222, and transmitted therethrough. Light of 1.552 μm in a first polarization mode, which corresponds to TE mode of the light source 1221, is coupled to TE mode of a first VDF 1224. In the first VDF 1224, light of 1.552 μm in TE mode is output through a first port 1225 and light at other wavelengths is caused to be output through a second port 1226. Light from the second port 1226 is coupled to a second VDF 1229 after its polarization direction is 90 degrees rotated by a λ/2 plate 1228. In other words, light of 1.548 μm in a second polarization mode, which corresponds to TM mode of the light source 1221, is coupled to TE mode of the second VDF 1229. In the second VDF 1229, light of 1.548 μm in TE mode is output through a first port 1230 and light at other wavelengths is caused to be output through a second port 1240.

Thus-transmitted light from the first and second VDFs 1224 and 1229 is converted to electric signals by photodiodes (PD) 1227 and 1231, and a difference signal between outputs from the photodiodes 1227 and 1231 is taken by a differential amplifier 1233 to produce a demodulated signal.

Also in this embodiment, the polarization conserving fiber 1223 is used. However, similar to the sixth embodiment, an ordinary single mode fiber and a polarization control device may be used, and feedback control may be performed using the output of the photodiode 1227, for example.

Further, in this embodiment, the λ/2 plate 1228 is used, and the TM mode light of the light source 1221 is coupled to the TE mode of the second VDF 1229. However, the TM mode light of the light source 1221 may be coupled to TM mode of the second VDF 1229, and the transmission wavelength for TM mode of the second VDF 1229 may be tuned to 1.548 μm.

Ninth Embodiment

Figure 15A:
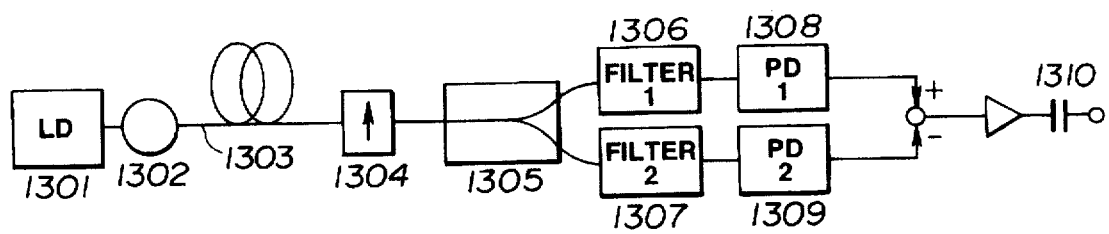
FIG. 15A is a view of a ninth embodiment of an optical communication system according to the present invention.

The ninth embodiment will be described with reference to FIG. 15A. In a communication system of this embodiment, a polarization sensitive waveguide type filter is used. In FIG. 15A, a light source apparatus 1301 is an oscillation polarization mode selective semiconductor laser used in the above embodiments, and its oscillated light is switched between light of 1.552 µm in TE mode and light of 1.548 µm in TM mode. Output light of the laser 1301 is coupled to a single mode optical fiber 1303 through a polarization insensitive isolator 1302, and transmitted therethrough. The signal light transmitted through the optical fiber 1303 is transmitted through a polarizer 1304 and divided into two portions by a demultiplexer 1305. Two divided portions are respectively coupled to TE modes of DFB filters 1306 and 1307. The transmission wavelength for TE mode of the DFB filter 1306 is tuned to 1.552 µm, and the transmission wavelength for TE mode of the DFB filter 1307 is tuned to 1.548 µm. Thus-transmitted light is converted to electric signals by photodiodes (PD) 1308 and 1309, and an alternating current component of a difference signal between outputs from the photodiodes 1308 and 1309 is taken by a differential amplifier and a capacitor 1310 to produce a demodulated signal.

In this embodiment, even if a polarization wave appears as an elliptically polarized wave at the light emission end of the optical fiber 1303, the polarization plane of signal light entering the receiver portion does not need to be controlled by using a polarization control device when the following fiber is used. Namely, such a fiber guarantees that the principal polarization direction of light at a first wavelength transmitted from the light source 1301 is maintained perpendicular to the principal polarization direction of light at a second wavelength, and the single mode optical fiber 1303 satisfies this condition. The reason therefor will be described with reference to FIGS. 16A through 19, by taking the case where linearly polarized light appears at the emission end of the fiber 303. In the following, $\lambda_1 = 1.552$ µm and $\lambda_2 = 1.548$ µm.

Figure 16A:
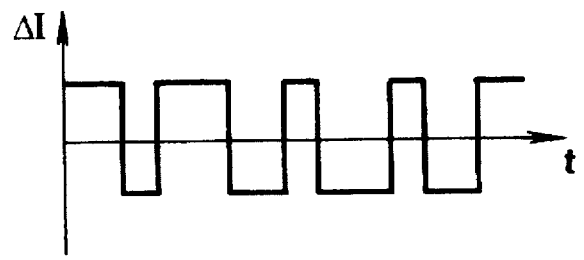
FIG. 16A is a graph illustrating a modulation current injected into a DFB laser in the ninth or tenth embodiment.
Figure 16B:
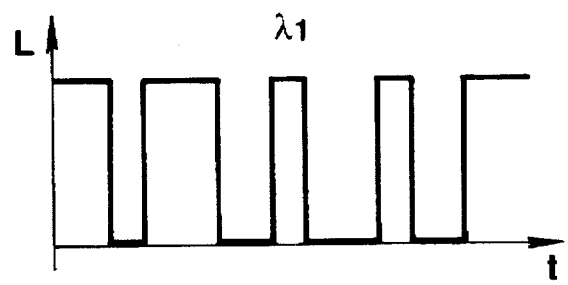
FIG. 16B is a graph illustrating the modulated intensity of light at a first wavelength from the DFB laser in the the ninth or tenth embodiment.
Figure 16C:
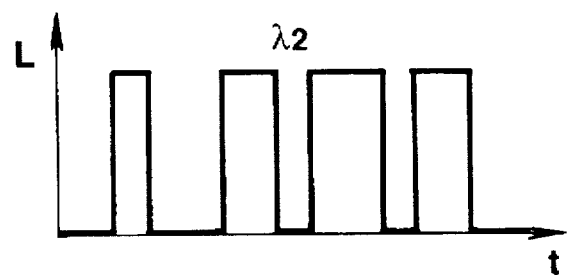
FIG. 16C is a graph illustrating the modulated intensity of light at a second wavelength from the DFB laser in the the ninth or tenth embodiment.

FIG. 16A illustrates digital signal, FIG. 16B illustrates the intensity L of light at wavelength $\lambda_1$ in TE mode at the light source 1301 and FIG. 16C illustrates the intensity L of light at wavelength $\lambda_2$ in TM mode at the same light source 1301. FIGS. 17 and 18 respectively illustrate two examples in which polarization directions of light entering the receiver portion are perpendicular to each other.

Figure 17A:
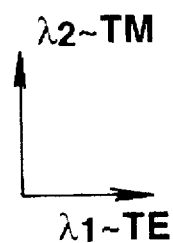
FIGS. 17A–17D are graphs illustrating the signal demodulating principle on a receiver side in the ninth or tenth embodiment when signal light on the receiver side has a first polarization plane.
Figure 17B:
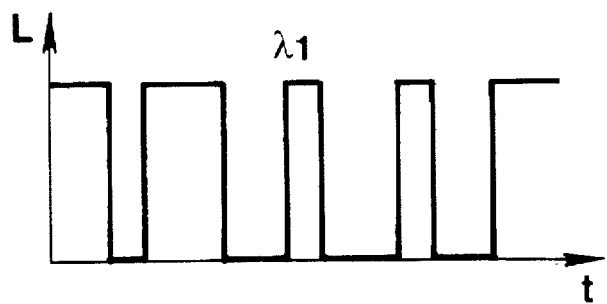
Figure 17C:
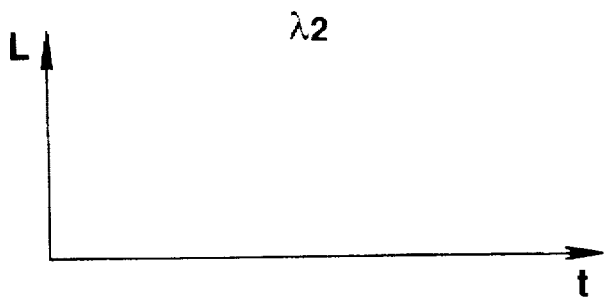
Figure 17D:
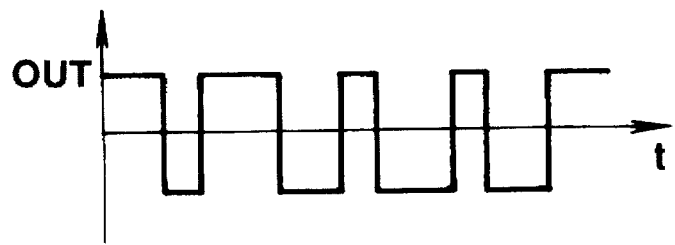

In FIG. 17A, light of $\lambda_1$ is coupled to TE mode of the receiver portion, and light of $\lambda_2$ cannot be transmitted through the polarizer 1304 since its polarization direction is one of TM mode. The intensity L of light transmitted through the DFB filter 1306 is illustrated in FIG. 17B, and the intensity L of light transmitted through the DFB filter 1307 is illustrated in FIG. 17C (in this case, none). The output signal illustrated in FIG. 17D can be obtained by adding those light signals with one of them reversed.

Figure 18A:
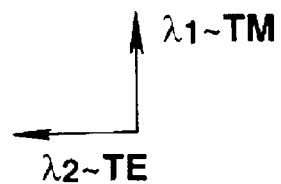
FIGS. 18A–18D are graphs illustrating the signal demodulating principle on a receiver side in the ninth or tenth embodiment when signal light on the receiver side has a second polarization plane.
Figure 18B:
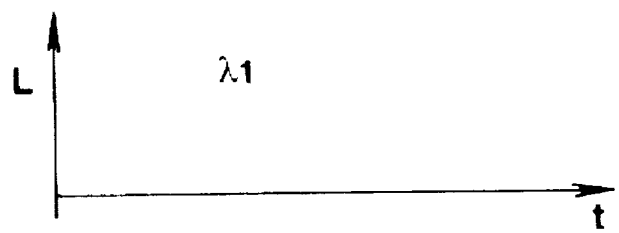
Figure 18C:
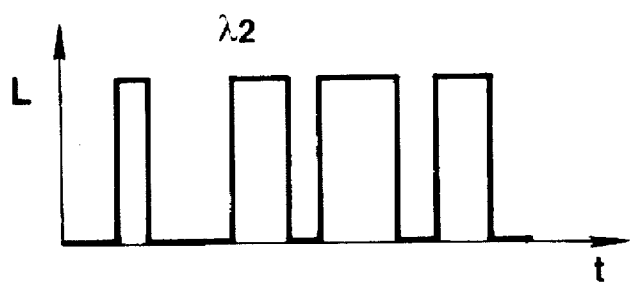
Figure 18D:
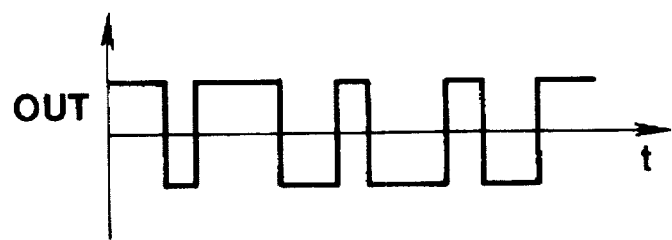

In FIG. 18A, light of $\lambda_2$ is coupled to TE mode of the receiver portion, and light of $\lambda_1$ cannot be transmitted through the polarizer 1304 since its polarization direction is one of TM mode. The intensity L of light transmitted through the DFB filter 1306 is illustrated in FIG. 18B (in this case, none), and the intensity L of light transmitted through the DFB filter 1307 is illustrated in FIG. 18C. Also in this case, the output signal illustrated in FIG. 18D can be obtained by adding those light signals of FIGS. 18B and 18C with one of them reversed. The output signal illustrated in FIG. 18D is about the same as the output signal illustrated in FIG. 17D.

Figure 19:
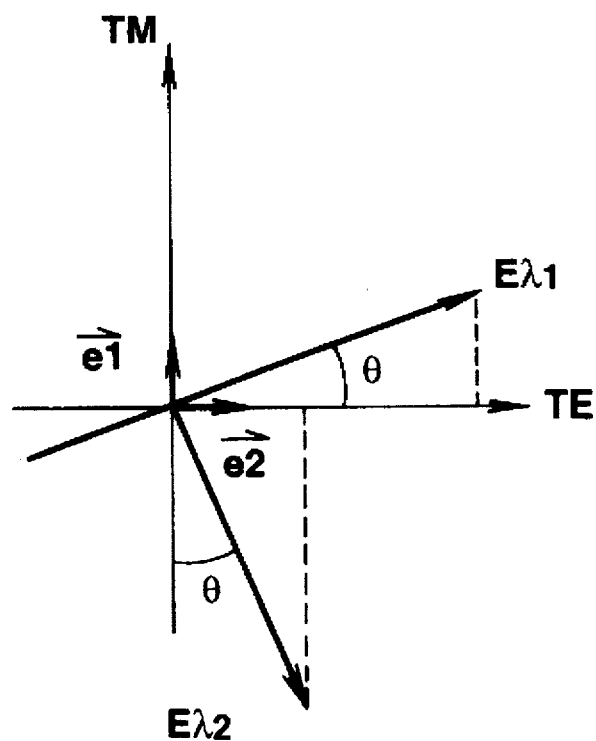
FIG. 19 is a view illustrating the principle that a signal can be demodulated on a receiver side in the ninth or tenth embodiment irrespective of the polarization plane of signal light on the receiver side.

If the linear polarization is maintained in the transmission line or optical fiber, light incident on the receiver portion from the optical fiber 1303 is linearly polarized and this light can be expressed by the combination of two mutually-perpendicular linearly polarized waves. In FIG. 19, electric field amplitudes of light at wavelengths $\lambda_1$ and $\lambda_2$ transmitted through the polarizer 1304 are respectively given as $E\lambda_1 \cos\theta$ and $E\lambda_2 \sin\theta$, where $\theta$ is the angle between field direction of light at $\lambda_1$ and field direction of light transmitted through the polarizer 1304. $E\lambda_1$ is the field amplitude of light at $\lambda_1$ and $E\lambda_2$ is the field amplitude of light at $\lambda_2$. The field amplitudes $E_{308}$ and $E_{309}$ of light incident on the photodetectors 1308 and 1309 after divided by the demultiplexer 1306 and transmitted through the filters 1306 and 1307 are respectively represented by:

$$E_{308} = 1/\sqrt{2} \cdot E_{\lambda 1} \cos\theta \cdot t_{\lambda 1}$$

$$E_{309} = 1/\sqrt{2} \cdot E_{\lambda 2} \sin\theta \cdot t_{\lambda 2}$$

where $t_{\lambda 1}$ is the transmittance of the filter 1306 at its transmission wavelength and $t_{\lambda 2}$ is the transmittance of the filter 1307 at its transmission wavelength. The signal taken out from the photodetectors is proportional to light power or the square of field amplitude, so signal amplitudes $I_{308}$ and $I_{309}$ taken out from the photodetectors 1308 and 1309 are given by:

$$I_{308} \sim 1/2 \cdot E_{\lambda 1}^2 \cos^2\theta \cdot t_{\lambda 1}^2$$

$$I_{309} \sim 1/2 \cdot E_{\lambda 2}^2 \sin^2\theta \cdot t_{\lambda 2}^2$$

Signal amplitude $I_{out}$ finally taken out as an ouput is proportional to the sum of $I_{308}$ and $I_{309}$, so the signal amplitude $I_{out}$ is represented as:

$$I_{out} \sim 1/2 \cdot E_{\lambda 1}^2 \cos^2\theta \cdot t_{\lambda 1}^2 + 1/2 \cdot E_{\lambda 2}^2 \sin^2\theta \cdot t_{\lambda 2}^2 \sim 1/2 E_{\lambda 1}^2 \cdot t_{\lambda 1}^2$$

when $E_{80\,1} \approx E_{\lambda 2}$ and $t_{\lambda 1} \approx t_{\lambda 2}$. Thus, a constant signal output can be obtained irrespective of the polarization direction of light incident on the receiver portion.

In the above description, coupling losses are disregarded and the linear polarization state is assumed to be maintained through the transmission line or fiber, for simplicity. Also in a general case of elliptically polarized light, a constant signal output can be considered to be obtained irrespective of the polarization direction by considering in the same manner, if the principal polarization directions of two elliptically polarized light signals are perpendicular to each other. Also in this embodiment, integration of devices can be readily performed.

Tenth Embodiment

Figure 15B:
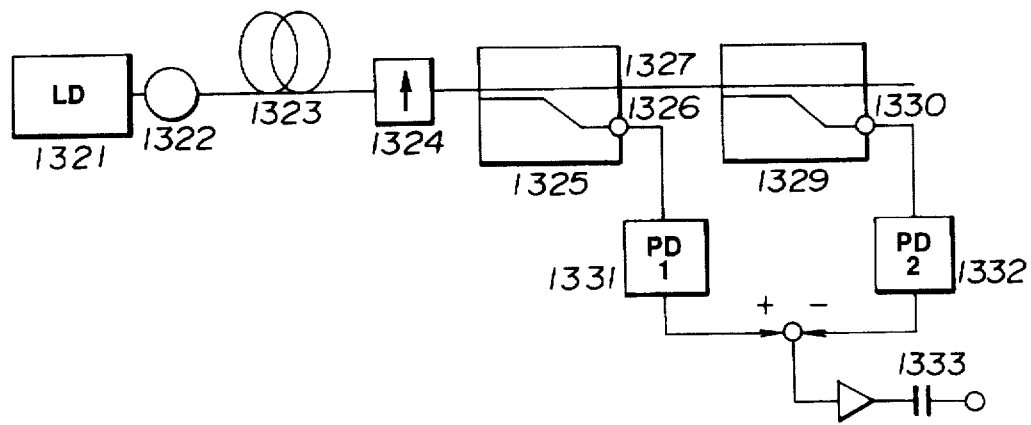
FIG. 15B is a view of a tenth embodiment of an optical communication system according to the present invention.

The tenth embodiment will be described with reference to FIG. 15B. This embodiment is different from the ninth embodiment in that another type of filter is used. In FIG. 15B, a light source 1321, a polarization insensitive isolator 1322 and a single mode fiber 1323 used as a transmission line are the same as those of the ninth embodiment, but a VDF is used as a filter, similar to the eighth embodiment. Signal light from the fiber 1323 is coupled to TE mode of the VDF 1325 through a polarizer 1324, and only light of 1.552 µm in TE mode is caused to be output through a first port 1326 and detected by a first photodetector 1331. Light of other wavelengths is coupled to a second VDF 1329 through a second port 1327 of the VDF 1325, and only light of 1.548 µm in TE mode is caused to be output through a first port 1330 and detected by a second photodetector 1332. Thus-transmitted light from the first and second VDFs 1325 and 1329 is converted to electric signals by photodiodes (PD) 1331 and 1332, and an alternating current component of a difference signal between outputs from the photodiodes 1331 and 1332 is taken by a differential amplifier and a capacitor 1333 to produce a demodulated signal. Also in this embodiment, similar to the ninth embodiment, a constant signal output can be obtained irrespective of the polarization direction of light incident on the receiver portion.

Further, in the ninth and tenth embodiments, the polarizers 1304 and 1324 are arranged at the input ports of the receiver portions for simplicity of explanation, but those are not necessarily needed. If the transmission wavelength for TM mode of each filter is in a wavelength band range which will not cause the problem of crosstalk, the polarizer can be eliminated.

Eleventh Embodiment

Figure 20:
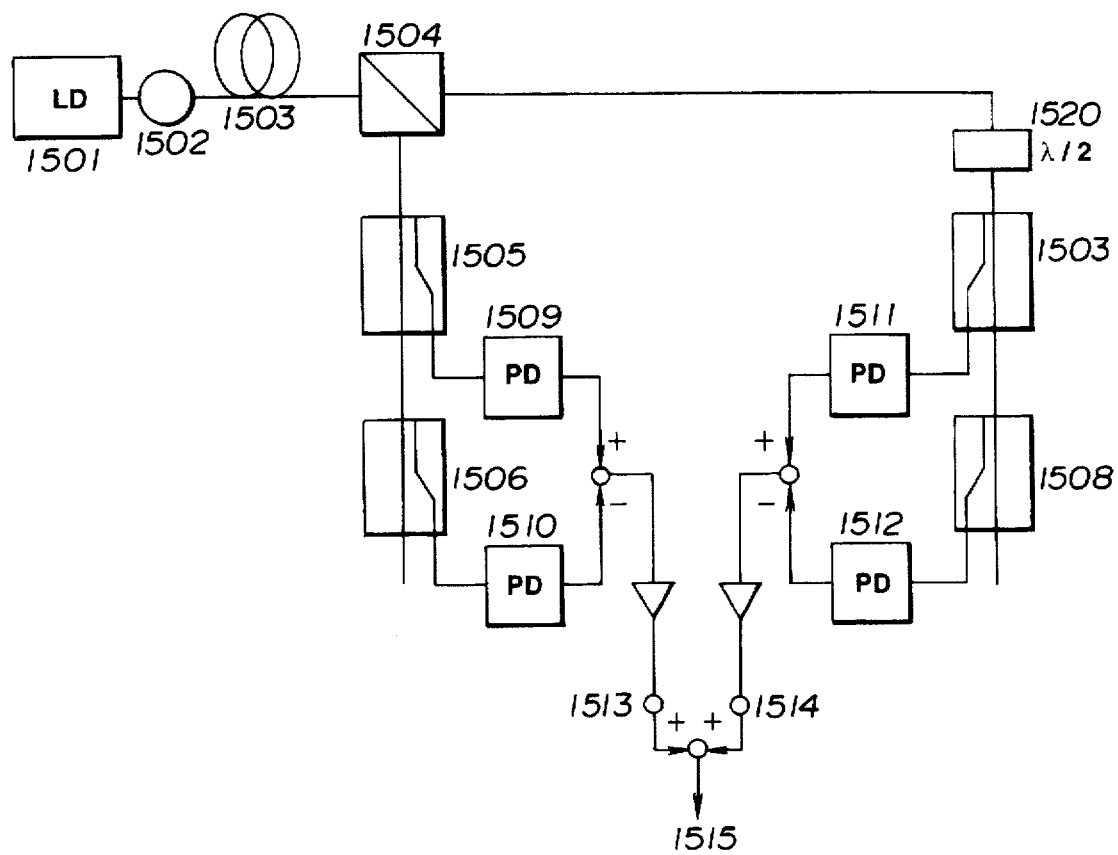
FIG. 20 is a view of an eleventh embodiment of an optical communication system according to the present invention.

The eleventh embodiment will be described with reference to FIG. 20. This embodiment adopts a communication system in which the seventh and eighth embodiments are combined with the ninth and tenth embodiments. In FIG. 20, output light from a polarization mode selective semiconductor laser 1501 is coupled to a single mode optical fiber 1503 through a polarization insensitive isolator 1502, and is transmitted therethrough. With respect to one of light components divided by a PBS 1504, light of 1.552 μm in TE mode is selected out by a VDF 1505, and light of 1.548 μm in TE mode is selected out by a VDF 1506. As for the other of the light components divided by the PBS 1504, light of 1.552 μm in TE mode is selected out by a VDF 1507 after its polarization direction is 90 degrees rotated by a λ/2 plate 1520, and light of 1.548 μm in TE mode is selected out by a VDF 1508. An output 1515 is obtained as a sum signal of a difference signal 1513 between outputs from photodetectors 1509 and 1510 and a difference signal 1514 between outputs from photodetectors 1511 and 1512. Compared with the ninth and tenth embodiments, S/N can be 3 dB improved because light, which cannot pass through the polarizer in the ninth or tenth embodiment, is received by a second set of filters.

In the seventh to eleventh embodiments, when the transmission bandwidth of filter and the wavelength difference between TE and TM modes are decided, wavelength multiplexing can be conducted according to either appropriate multiplexing system illustrated in FIG. 4 or 8.

Moreover, descriptions about the operation of a polarization sensitive filter have been made using its operation for TE mode. However, as all or some filters, a filter whose transmission wavelength is set for light in TM mode may be used to effect the same function. For example, instead of using a λ/2 plate, a device, whose transmission wavelength is set for light in TM mode, may be used. Further, a polarization insensitive isolator only needs to act for the prevention of return light to a semiconductor laser.

Twelfth Embodiment

Figure 21:
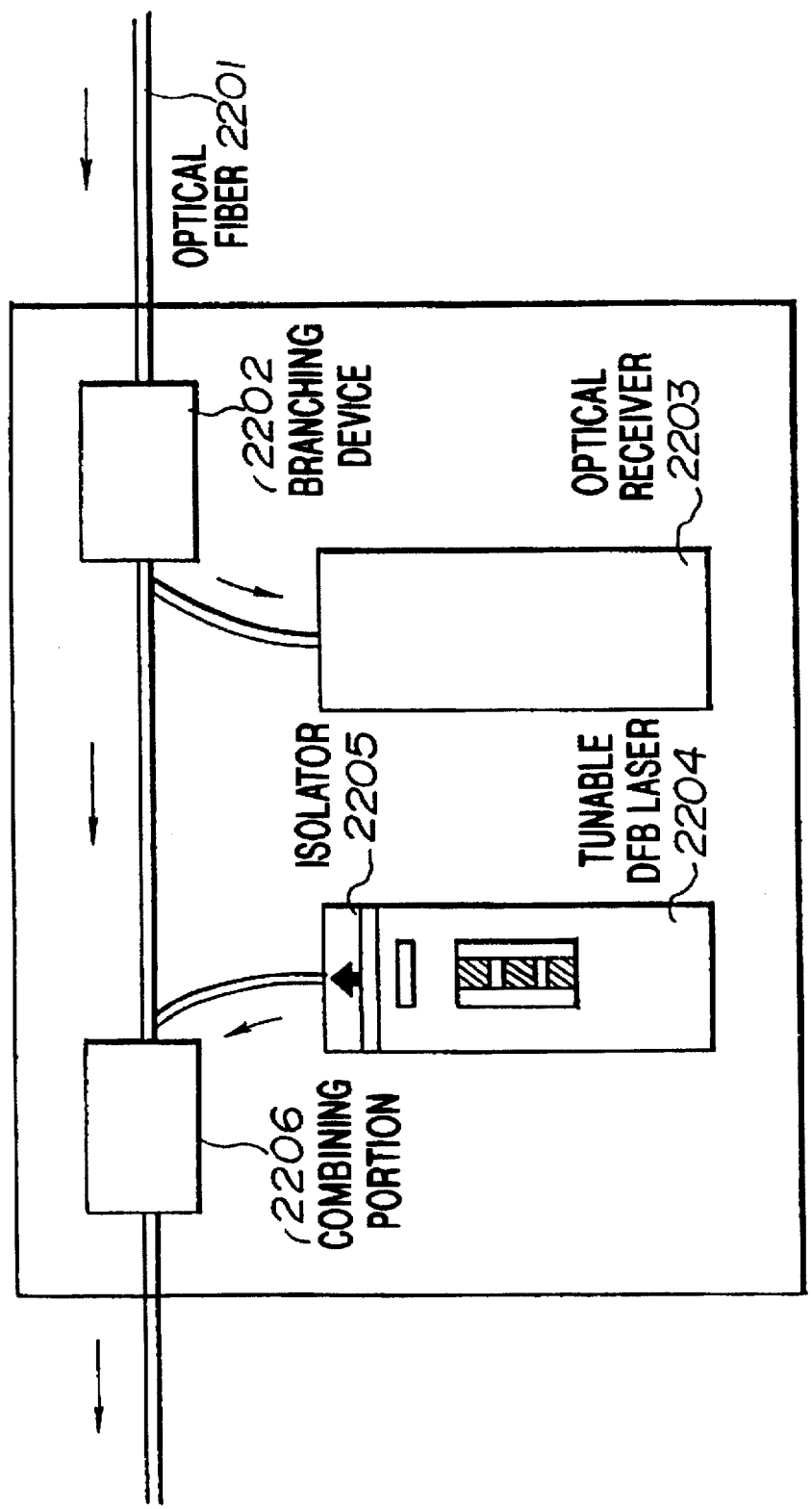
FIG. 21 is a view of a twelfth embodiment according to the present invention, showing an optical node which utilizes an optical communication system of the present invention.

A twelfth embodiment will be described with reference to FIGS. 21 and 22. The twelfth embodiment is directed to an optical local area network (LAN) system using an optical communication system of the present invention. FIG. 21 illustrates an opto-electric converting unit (node), which is connected to a terminal of the optical LAN system shown in FIG. 22.

Figure 22:
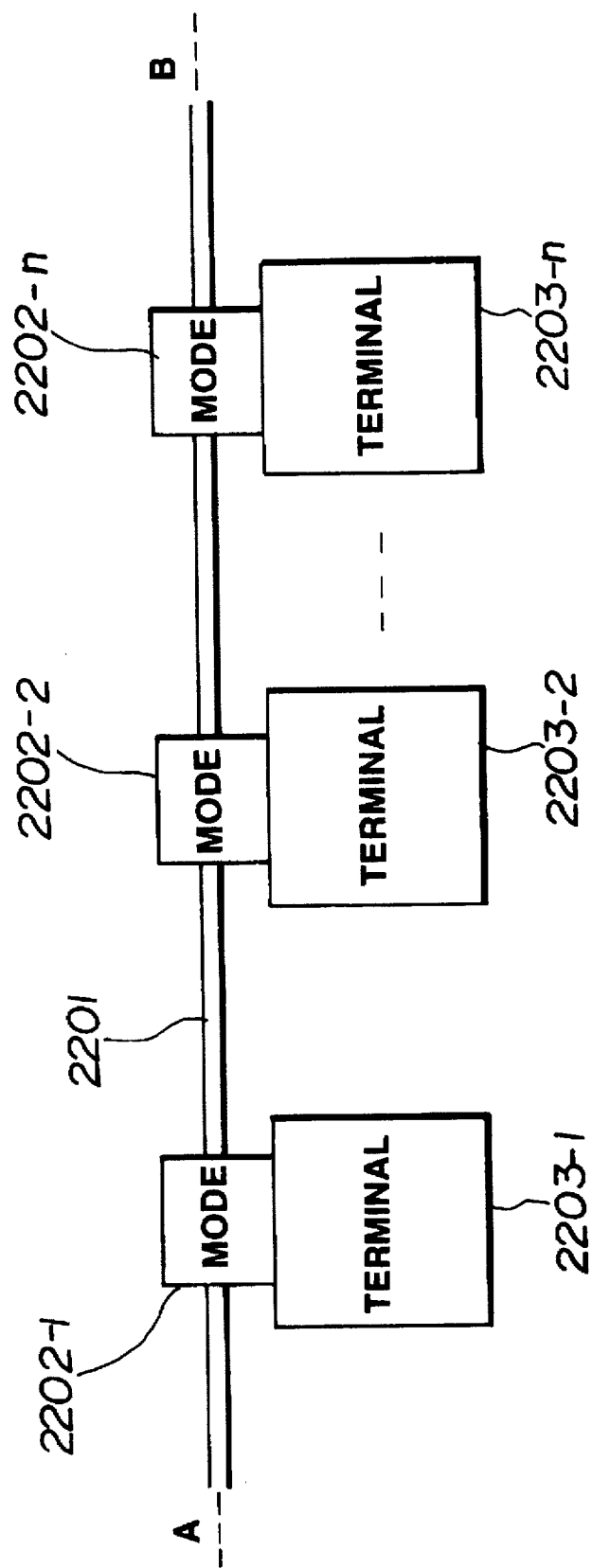
FIG. 22 is a view of an optical local area network (LAN) according to the present invention.

In the bus-type network shown in FIG. 22, multiple terminals 2203-1, 2203-2, . . . , 2203-n are respectively connected to an optical fiber 2201 through nodes 2202-1, 2202-2, . . . , 2202-n along a direction A-B. At some places on the optical fiber 2201, optical amplifiers (not shown) are serially connected to compensate for attenuation of the transmitted signal light.

In FIG. 21, a light signal is taken into the node 2202 through the optical fiber 2201, and a portion of the signal is input into an optical receiver 2203 by a branching device 2202. The optical receiver 2203 includes a tunable optical filter and a photodetector shown in FIG. 5B, for example, and only signal light at a desired wavelength is taken out from the incident signal light, and the signal is detected.

On the other hand, when a light signal is transmitted from the node, signal light from a light source apparatus or tunable DFB laser 2204 is input into the optical fiber 2201 at a combining portion 2206 through an isolator 2205.

A plurality of tunable optical filters and tunable DFB lasers may be arranged in a node to widen the wavelength changeable range. Further, two nodes may be connected to each terminal and two optical fibers may be provided to accomplish bi-directional transmission of a DQDB system.

In such an optical network system, when the optical communication system of the present invention is used, a high-density wavelength or optical frequency division multiplexing network having the multiplicity of 60, for example, as described above can be constructed. As a network, a loop type, which is constructed by connecting A and B in FIG. 22, a star type, a loop type or a compound configuration thereof may be used.

Thirteenth Embodiment

Figure 23:
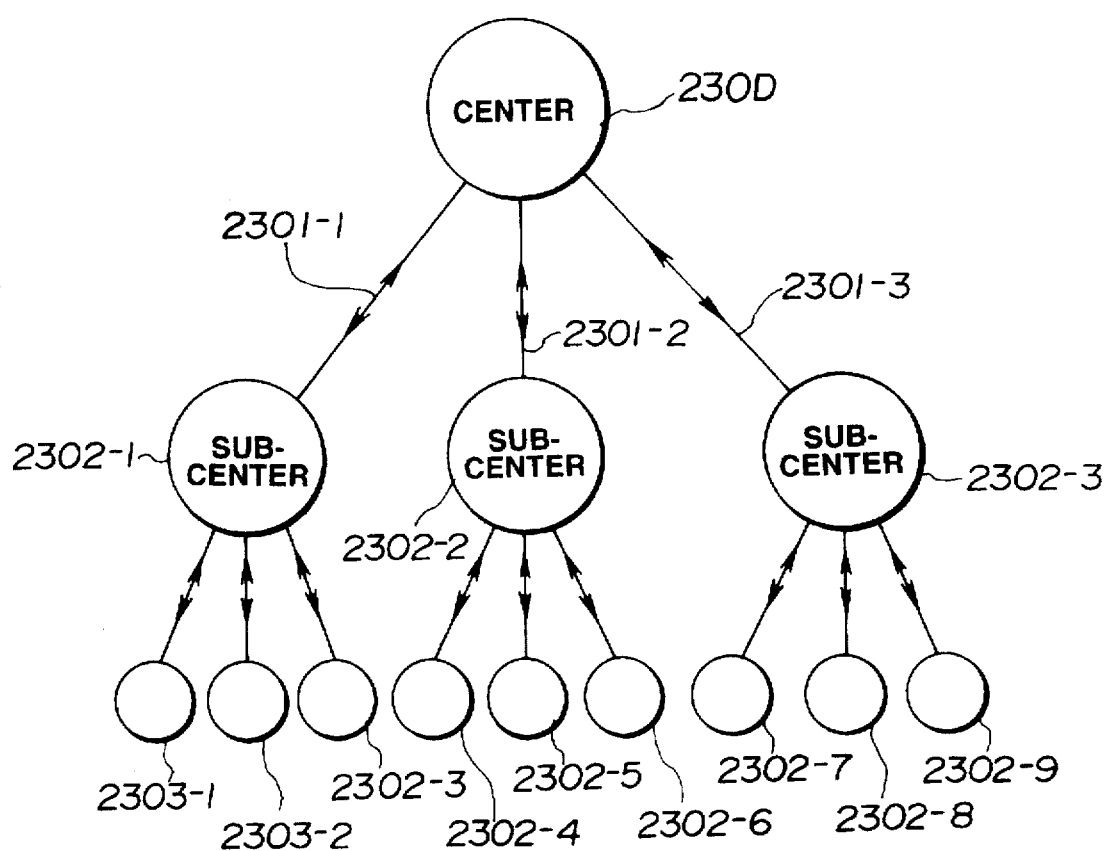
FIG. 23 is a view of an optical cable television (CATV) system according to the present invention.

A bi-directional optical CATV system, as shown in FIG. 23, can be constructed using an optical communication system of the present invention. In FIG. 23, reference numeral 2300 is a CATV center, reference numerals 2302-1, 2302-2 and 2302-3 are respectively sub-centers connected to the center 2300 by optical fibers 2301-1, 2301-2 and 2301-3, and reference numerals 2303-1, 2303-2, . . . , 2303-9 are respectively receivers of subscribers connected to the sub-centers 2302-1, 2302-2 and 2302-3. In the center 2300, a light source apparatus or tunable laser is polarization-modulated, and a plurality of video signals are carried on signal light of different wavelengths to transmit the signals to the receivers 2303-1, 2303-2, . . . , 2303-9. Each receiver includes a tunable wavelength filter a photodetector, and only signal light at a desired wavelength of input signal light is detected to reproduce a picture image on a monitor. On the subscriber side, the transmission wavelength of the tunable filter is changed to select a desired channel. Thus, a desired picture image can be obtained. Conventionally, it was difficult to use such a DFB filter in that system due to dynamic wavelength fluctuation of a DFB laser. The present invention enables the use of such a DFB filter.

Further, a bi-directional CATV is possible in the following manner. The receiver 2303 has an external modulator (an example of a simple bi-directional optical network, an optical local area network (LAN) system CATV, see, for example, Ishikawa and Furuta "LiNbO$_3$ Optical Wavelength Modulator For Bi-directional Transmission in Optical CATV Subscriber Systems", OCS 91-82 1991), and a signal from the subscriber is received as a reflected light (reflected light of a signal light transmitted to the subscriber) from its external modulator. Thus, highly improved services can be obtained.

According to the present invention, a high-density optical frequency division multiplexing communication system using a semiconductor laser driven by a direct modulation method with small dynamic wavelength fluctuation can be constructed without necessitating high-degree wavelength control techniques and electronic circuit techniques, such as coherent optical communication techniques.

Further, in the optical communication system of the present invention in which two wavelengths from an oscillation polarization mode selective laser are both discriminated and detected, the receiving sensitivity can be improved. In this case, even when a polarization sensitive filter is used, a signal for controlling the polarization plane of light incident on a receiver portion can be taken out and a signal can be detected irrespective of the polarization plane of light incident on the receiver portion.

Except as otherwise disclosed herein, the various components shown in outline or block form in the Figures are individually well known in the optical semiconductor device and optical communication arts, and their internal construction and operation are not critical either to the making or using of this invention or to a description of the best mode of the invention.

While the present invention has been described with respect to what are presently considered to be the preferred embodiments, it is to be understood that the invention is not limited to the disclosed embodiments. The present invention is intended to cover various modifications and equivalent arrangements included within the sprit and scope of the appended claims.

What is claimed is:

1. An optical communication system for communicating between a transmitter means and a receiver means, said system comprising:

transmitter means for transmitting a modulated light signal, said transmitter means comprising a polarization mode selective semiconductor laser having an oscillated state modulated between a first state having a first polarization direction and a first wavelength and a second state having a second polarization direction and a second wavelength, in accordance with a modulation signal applied to said laser; and receiver means for demodulating said modulated light signal, said receiver means comprising filtering means including at least one optical filter which selects one of the first wavelength light and the second wavelength light.

2. An optical communication system according to claim 1, wherein the modulation signal is superimposed as a modulation current with a fixed bias current, and injected into said laser directly.

3. An optical communication system according to claim 1, wherein said transmitter means and said receiver means are connected by an optical fiber.

4. An optical communication system according to claim 1, further comprising a photodetector for detecting said selected signal.

5. An optical communication system according to claim 1, wherein said filtering means includes a single optical filter.

6. An optical communication system according to claim 1, wherein said optical filter comprises one of a Fabry-Perot etalon, a Mach-Zehnder type optical filter and a fiber Fabry-Perot type optical filter.

7. An optical communication system according to claim 1, wherein said optical filter has a polarization sensitivity for a transmitted wavelength.

8. An optical communication system according to claim 4, wherein said transmission line comprises a polarization conserving optical fiber for controlling polarization planes of the light signals incident on the receiver side.

9. An optical communication system according to claim 7, further comprising polarization plane control means for controlling polarization planes of the light signals incident on the receiver side.

10. An optical communication system according to claim 7, wherein said optical filter comprises one of a directional coupler type optical filter and a distributed feedback type optical filter.

11. An optical communication system according to claim 7, wherein said first polarization direction corresponds to a transverse electric mode, said second polarization direction corresponds to a transverse magnetic mode, and the light from the transverse electric mode of said laser is coupled to the transverse magnetic mode of said optical filter.

12. An optical communication system according to claim 7, wherein said first polarization direction corresponds to a transverse electric mode, said second polarization direction corresponds to a transverse magnetic mode, and the light from the transverse magnetic mode of said laser is coupled to the transverse electric mode of said optical filter.

13. An optical communication system according to claim 3, wherein said optical fiber is a single mode optical fiber.

14. An optical communication system according to claim 1, wherein said optical filter comprises a tunable optical filter whose transmission wavelength is changeable.

15. An optical communication system according to claim 1, further comprising a polarization insensitive isolator and wherein the light signals output from said transmitter means are incident on said transmission line through said isolator.

16. An optical communication system according to claim 1, wherein said filtering means includes two optical filters, and one of said two optical filters selects the first wavelength light and the other of said two optical filters selects the second wavelength light.

17. An optical communication system according to claim 16, further comprising polarization splitting means and polarization plane control means for controlling the polarization planes of said modulated light signal incident on the receiver means.

18. An optical communication system according to claim 17, wherein said polarization splitting means comprises a polarization beam splitter.

19. An optical communication system according to claim 16, further comprising a light branching device, wherein said modulated signal is divided by said light branching device and directed to said optical filters.

20. An optical communication system according to claim 16, further comprising an optical demultiplexer, wherein said modulated signal is demultiplexed by said demultiplexer and directed to said optical filters.

21. An optical communication system according to claim 16, further comprising a polarizer, wherein said modulated signal is directed to said optical filters through said polarizer.

22. An optical communication system according to claim 16, wherein said modulated signal is directed to said optical filters through said polarization splitting means.

23. An optical communication system according to claim 16, wherein said transmitter means and said receiver means are connected by polarization conserving optical fiber for controlling polarization planes of the modulated light signal incident on the receiver means.

24. A method for performing optical communication, comprising the steps of:

modulating the oscillated light of a polarization mode selective semiconductor laser between a first state having a first wavelength and a first polarization direction, and a second state having a second wavelength and a second polarization direction;

outputting said modulated light from transmitter means; and receiving at receiver means at least one of the first or the second wavelengths by performing a selection using an optical filter.

25. A method according to claim 24, wherein said receiver means has two optical filters, one of which selects said first wavelength and the other of which selects said second wavelength, each of which detects the selected light and demodulates said modulated light by generating a difference signal between the detected two signals.

26. An optical communication system according to claim 16, wherein each of the lights selected by said two optical filters are detected, a difference signal between the detected two signals are generated, and demodulation is performed based on the difference signal.

27. An optical communication system according to claim 16, wherein said two optical filters are a first optical filter which has a transparent peak at the first wavelength corresponding to incident light of a third polarization direction, and a second optical filter having a transparent peak at the second wavelength corresponding to incident light of a fourth polarization direction, and wherein, among the modulated light, the light modulated to the first polarization direction is input to said first optical filter in the third polarization direction, and the light modulated to the second polarization direction is input to said second optical filter in the fourth polarization direction.

28. An optical communication system according to claim 27, wherein said modulated light having one of the third and fourth polarization directions is incident upon said two optical filters.

29. An optical communication system according to claim 27, wherein the fourth polarization direction is the same as the third polarization direction.

30. An optical communication system according to claim 28, said filtering means further comprising:

a third optical filter having a transparent peak at the first wavelength corresponding to incident light of a fifth polarization direction; and a fourth optical filter having a transparent peak at said second wavelength corresponding to incident light of a sixth polarization direction;

wherein the modulated light input to said third and fourth optical filters has a polarization direction different from a polarization direction of the modulated light input to said first and second optical filters.

31. An optical communication system according to claim 30, wherein the fifth polarization direction is the same as the third polarization direction.

32. An optical communication system according to claim 30, wherein the sixth polarization direction is the same as the third polarization direction.

33. An optical communication system according to claim 1, further comprising a second transmitter means, said optical communication system executing wavelength division multiplexing communication.

34. An optical communication system according to claim 33, wherein an interval between the first and the second wavelength of the modulated light signal is narrower than an interval between two wavelengths next to each other on a wavelength axis among the light output from a plurality of communication devices.

35. An optical communication system according to claim 33, wherein an interval between the first and the second wavelength of the modulated light signal is wider than an interval between two wavelengths next to each other on a wavelength axis among the light output from a plurality of communication devices.

36. An optical communication system according to claim 1, wherein said polarization mode selective semiconductor laser comprises a diffraction grating.

* * * * *

UNITED STATES PATENT AND TRADEMARK OFFICE
CERTIFICATE OF CORRECTION

PATENT NO. : 5,742,418　　　　　　　　　　Page 1 of 2
DATED　　　 : April 21, 1998
INVENTOR(S) : Mizutani et al.

It is certified that error appears in the above-indentified patent and that said Letters Patent is hereby corrected as shown below:

COLUMN 1:

Line 43, "$\overset{\circ}{A}0$" should read --$\overset{\circ}{A}$--; and
    Line 66, "accoustic" should read --acoustic--.

COLUMN 6:

Line 26, "in the the" should read --in the--; and
    Line 29, "in the the" should read --in the--.

COLUMN 11:

Line 67, "using a" should read --using an--.

COLUMN 16:

Line 37, "$E_{80\ 1}$" should read --$E_{\lambda 1}$--.

COLUMN 18:

Line 45, "filter a" should read --filter, a--.

UNITED STATES PATENT AND TRADEMARK OFFICE
CERTIFICATE OF CORRECTION

PATENT NO. : 5,742,418
DATED : April 21, 1998
INVENTOR(S) : Mizutani et al.

It is certified that error appears in the above-indentified patent and that said Letters Patent is hereby corrected as shown below:

COLUMN 19:

Line 66, "claim 4," should read --claim 3,--.

COLUMN 21:

Line 17, "are" should read --is--; and
    Line 18, "are" should read --is--.

Signed and Sealed this

Fifth Day of January, 1999

Attest:

*Attesting Officer*      *Acting Commissioner of Patents and Trademarks*